(12) United States Patent
Kato

(10) Patent No.: US 7,561,476 B2
(45) Date of Patent: Jul. 14, 2009

(54) NONVOLATILE MEMORY, VERIFY METHOD THEREFOR, AND SEMICONDUCTOR DEVICE USING THE NONVOLATILE MEMORY

(75) Inventor: Kiyoshi Kato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 461 days.

(21) Appl. No.: 11/072,198

(22) Filed: Mar. 3, 2005

(65) Prior Publication Data

US 2005/0162908 A1 Jul. 28, 2005

Related U.S. Application Data

(63) Continuation of application No. 10/822,388, filed on Apr. 12, 2004, now Pat. No. 6,876,581, which is a continuation of application No. 10/131,840, filed on Apr. 25, 2002, now Pat. No. 6,768,680.

(30) Foreign Application Priority Data

Apr. 27, 2001 (JP) ............................. 2001-133689

(51) Int. Cl.
*G11C 16/04* (2006.01)
(52) U.S. Cl. .................... 365/185.24; 365/185.22; 365/185.17; 365/233.1; 365/185.25
(58) Field of Classification Search ............ 365/185.24, 365/185.22, 185.17, 233.1, 185.25
See application file for complete search history.

(56) References Cited

U.S. PATENT DOCUMENTS

| | | | | |
|---|---|---|---|---|
| 5,463,587 A * | 10/1995 | Maruyama | ............ | 365/185.22 |
| 5,475,249 A * | 12/1995 | Watsuji et al. | ......... | 365/185.22 |
| 5,477,495 A * | 12/1995 | Tanaka et al. | ............... | 365/203 |
| 5,590,074 A * | 12/1996 | Akaogi et al. | .......... | 365/185.22 |
| 5,602,789 A * | 2/1997 | Endoh et al. | ............ | 365/185.03 |
| 5,740,112 A * | 4/1998 | Tanaka et al. | .......... | 365/189.01 |
| 5,757,700 A | 5/1998 | Kobayashi | ............... | 365/189.1 |
| 5,943,262 A * | 8/1999 | Choi | ..................... | 365/185.17 |
| 6,038,167 A * | 3/2000 | Miwa et al. | ............ | 365/185.03 |
| 6,046,933 A * | 4/2000 | Nobukata et al. | ...... | 365/185.03 |
| 6,046,940 A * | 4/2000 | Takeuchi et al. | ........ | 365/185.17 |
| 6,058,042 A * | 5/2000 | Nobukata | ............... | 365/185.03 |
| 6,108,238 A * | 8/2000 | Nakamura et al. | ..... | 365/185.22 |
| 6,154,391 A * | 11/2000 | Takeuchi et al. | ........ | 365/185.24 |
| 6,172,912 B1 * | 1/2001 | Hirano et al. | .......... | 365/185.28 |
| 6,243,290 B1 * | 6/2001 | Kurata et al. | ........... | 365/185.03 |
| 6,288,935 B1 | 9/2001 | Shibata et al. | ......... | 365/185.03 |
| 6,411,551 B1 * | 6/2002 | Kim et al. | ............... | 365/185.24 |
| 6,459,621 B1 * | 10/2002 | Kawahara et al. | ...... | 365/185.24 |

(Continued)

FOREIGN PATENT DOCUMENTS

JP 9-293387 11/1997

*Primary Examiner*—Thong Q Le
(74) *Attorney, Agent, or Firm*—Cook Alex Ltd.

(57) ABSTRACT

Provided is a nonvolatile memory that realizes a high-speed verify operation. During verify writing/erasing, the writing/erasing and reading are performed at the same time. As to a circuit that performs a verify operation, for instance, there is obtained a construction where the output from a sense amplifier (102) that performs reading is connected to a switch which switches an operation voltage applied to a memory cell in accordance with a verify signal Sv, and the verify operation is finished concurrently with having the verify signal Sv switched. By obtaining such circuit construction and simultaneously performing writing/erasing and reading, it becomes possible to perform high-speed verify writing/erasing.

60 Claims, 26 Drawing Sheets

U.S. PATENT DOCUMENTS

| | | | |
|---|---|---|---|
| 6,686,623 B2 | 2/2004 | Yamazaki | 257/315 |
| 6,781,895 B1* | 8/2004 | Tanaka et al. | 365/200 |
| 2002/0003723 A1* | 1/2002 | Tanzawa et al. | 365/185.22 |
| 2002/0080649 A1* | 6/2002 | Yamada et al. | 365/185.03 |
| 2002/0126531 A1* | 9/2002 | Hosono et al. | 365/185.17 |
| 2003/0002348 A1* | 1/2003 | Chen et al. | 365/189.01 |

* cited by examiner

NONVOLATILE MEMORY, VERIFY METHOD THEREFOR, AND SEMICONDUCTOR DEVICE USING THE NONVOLATILE MEMORY

This application is a continuation of U.S. application Ser. No. 10/822,388 filed on Apr. 12, 2004 now U.S. Pat. No. 6,876,581 which is a continuation of U.S. application Ser. No. 10/131,840 filed on Apr. 25, 2002 (now U.S. Pat. No. 6,768,680 issued Jul. 27, 2004.

BACKGROUND OF THE INVENTION

1. Field of the Invention

The present invention relates to a semiconductor nonvolatile memory. In particular, the present invention relates to an electrically writable and erasable semiconductor nonvolatile memory (also referred to as the "EEPROM" or "electrically erasable and programmable read only memory"). Also, the present invention relates to a semiconductor device which has the semiconductor nonvolatile memory.

It should be noted here that the term "electrically writable and erasable semiconductor nonvolatile memory (EEPROM)" refers to a whole of semiconductor nonvolatile memories that are electrically writable and electrically erasable, and examples thereof include an EEPROM that is capable of performing erasing on a bit-by-bit basis and a flash memory. Also, unless being specified, the terms "nonvolatile memory" and "semiconductor nonvolatile memory" are used as synonyms for the term "EEPROM". Also, the term "semiconductor device" refers to a whole of devices that function by utilizing semiconductor characteristics. Examples of the semiconductor device include a microprocessor, electrooptical devices such as a liquid crystal display device and a light-emitting device, and an electronic equipment in which there is installed a microprocessor or an electrooptical device.

2. Related Background Art

In recent years, an electrically writable and erasable semiconductor nonvolatile memory (EEPROM) (in particular, a flash memory) has drawn attention as a strong candidate for a memory that will replace a magnetic disk or a DRAM. In particular, a so-called multilevel nonvolatile memory, in which each memory element stores multi-state data more than binary data, receives attention as a mass storage memory.

In the EEPROM, there are usually performed verify writing or verity erasing that includes an operation for confirming that a state after writing or erasing exists within a predetermined range. In particular, in a multilevel nonvolatile memory, it is required to control the state after writing or erasing with high precision, therefore such a verify operation becomes indispensable.

In a conventional verify writing/erasing operation, an operation period for performing writing/erasing for a certain period, and a reading period for confirming that the state after writing/erasing exists within a predetermined range, are alternately performed.

A manner in which the operation period and the reading period are alternately performed will be described with reference to FIGS. 2 and 3. FIG. 2 is a simplified block diagram in which a reading circuit 202 and writing/erasing circuit 201 are connected to a selected memory cell 203. A verify signal Sv is outputted from the reading circuit 202 and is inputted into the writing/erasing circuit 201. The writing/erasing circuit 201 performs writing/erasing by referring to the verify signal Sv. A procedure for verify writing/erasing is shown in FIG. 3. In FIG. 3, the reading circuit first operates (denoted as "active") to perform reading. During this operation, the writing/erasing circuit does not operate (denoted as "not active"). The verify signal Sv outputted from the reading circuit becomes "Low" in the case where a read state of the memory cell differs from a target state. On the other hand, the verify signal Sv becomes "High" in the case where the read state of the memory cell coincides with the target state. In the case where the verify signal Sv is Low, the writing/erasing circuit starts its operation (becomes "active") after the reading operation is finished, to perform writing/erasing for a certain period. Following this, reading is performed again and the state of the memory cell is compared with the target state. Then, in a like manner, if the verify signal Sv remains Low, writing/erasing is performed again for a certain period. At a point when the verify signal Sv becomes High after repeating these operations, the verify writing/erasing is finished. The conventional verify operation is performed in this manner.

The verify operation described above is an extremely effective means as a method of controlling the threshold voltage of a memory element with high precision. In particular, in the case of a multilevel nonvolatile memory that requires a narrow distribution width of the threshold voltage or in the case where the increases of variations are unavoidable due to the miniaturization, the verify operation is indispensable. However, the conventional verify operation necessitates the repetition of writing/erasing and reading, which leads to a problem that this verify operation essentially takes long time in comparison with a single operation in which reading is not performed. Further, an operation voltage in the writing/erasing becomes high in comparison with a case of reading, and the writing/erasing may require pre-charging or pre-discharging depending on which reading scheme is used. This causes a further reduction in the speed of the verify operation.

That is, there arises a problem due to the variations of a threshold voltage in the single operation, and there arises a problem due to an operation speed in the verify operation. As a result, performing a high-speed operation with a narrow distribution width of the threshold voltage becomes an important subject in order to improve the performance of a nonvolatile memory.

The present invention has been made in the light of the problems described above. An object of the present invention is to provide a nonvolatile memory that enables high-speed writing/erasing with a narrow distribution width of a threshold voltage. In more detail, an object of the present invention is to provide a verify method that realizes a high-speed operation by shortening a verify operation time and a nonvolatile memory using the verify method. Also, an object of the present invention is to provide a semiconductor device which has such a nonvolatile memory.

SUMMARY OF THE INVENTION

A fundamental idea underlying the present invention is that, to realize a high-speed verify operation, there is avoided the repetition of writing/erasing and reading, which has been a factor of consuming a long time in the conventional verify operation. To realize such a verify operation, the most distinguishing feature of the present invention is that writing/erasing and reading are performed at the same time.

The fundamental idea of the verify operation of the present invention is illustrated in the simplified block diagram and the timing chart shown in FIGS. 2 and 4. The block diagram shown in FIG. 2 is the same as the block diagram for the description of the conventional verify operation. In FIG. 2, the reading circuit 202 and the writing/erasing circuit 201 are connected to the selected memory cell 203, and the verify signal Sv outputted from the reading circuit 202 is inputted into the writing/erasing circuit 201. The difference from the conventional verify operation is clearly shown in the timing chart shown in FIG. 4. That is, according to the present invention, writing/erasing and reading are performed at the same time. The verify signal Sv outputted from the reading circuit reflects the state of the memory cell at all times. The verify signal Sv becomes Low in the case where the state of the memory cell differs from a target state, and becomes High in the case where the state of the memory cell coincides with the target state. Also, the writing/erasing circuit refers to Sv at all times and finishes the writing/erasing immediately after the verify signal Sv becomes High.

As described above, the writing/erasing is performed until the polarity of the verify signal Sv is reversed.

As a result, it becomes possible to dramatically shorten a writing/erasing time in comparison with the conventional verify scheme with which writing/erasing and reading are performed in alternate order. In this case, in addition to the effect that the reading time is shortened, there is also obtained an effect that there are shortened a delay time due to variations in potential between writing/erasing and reading and a preparation time required for pre-charging and the like.

In this specification, this scheme will be hereinafter referred to as the "constant verify scheme" since reading is constantly performed at all times with the verify scheme described above.

With the constant verify scheme, the writing/erasing and the reading are performed at the same time, therefore it is impossible to apply a conventional reading method as it is. As a result, it is required to use a reading method described below. With the conventional reading method, a judgement is made with reference to whether a memory element is placed in an ON state or in an OFF state and an operation is performed with a low voltage. However, with the reading method applied to the constant verify scheme, it is required to perform reading regardless of whether a memory element is placed in an ON state or in an OFF state. Also, it is required to perform an operation with a high voltage during writing/erasing.

Although it is possible to refer to the following embodiment modes for more detailed information, there frequently occurs a case where a reading accuracy becomes inferior to a case where a judgement is made with reference to whether a memory element is in an ON state or in an OFF state. Accordingly, in the present invention, it becomes important to reduce threshold voltage errors generated during reading. In more detail, it is preferable that the varying degree of a reading amount with respect to a threshold voltage is small and the reading is performed at high speed.

On the other hand, a reading operation performed at a high voltage is preferable because a reading speed is increased. Needless to say, a consumed current is increased in comparison with a case of conventional reading. However, when consideration is given to the fact that writing/erasing is simultaneously performed, the consumed current during the constant verify operation is reduced in comparison with the conventional verify operation.

Here, variations after a verify operation will be described. With the conventional verify operation, it is possible to perform precise reading. However, there exist some elements whose threshold voltages somewhat exceed a target threshold voltage, which determines a distribution width since writing is performed for a certain period. In the present invention, although such variations of a distribution caused due to the above phenomenon do not occur, the reading accuracy is not so high as in the case of the conventional reading method and reading errors determine the distribution width after verify. Accordingly, in the case where the conventional scheme and the constant verify scheme are compared with each other, it is impossible to simply conclude which scheme realizes a narrow distribution width and this depends on which scheme is adopted (the length of a conventional writing period, the reading scheme for the constant verify, and the like). However, in the case where similar distribution widths after verify are obtained, or in the case where a difference of the distribution widths is small enough not to cause any practical problem, the verify scheme of the present invention is superior to the conventional scheme because an operation speed is enormously improved.

There exists no limitation on the structure of the constant verify scheme of the present invention so long as the structure is a verify scheme based on the idea described above. Accordingly, the constant verify scheme of the present invention includes various embodiment modes. Here, an example of the embodiment modes will be simply described and the constant verify scheme will be described using a typical circuit diagram and timing chart. As to detailed embodiments, it is possible to refer to the following embodiment modes and examples.

As embodiments, for instance, it is possible to consider a plurality of structures for each of (1) the type of a memory element, (2) a charge injection/discharge scheme, (3) a reading scheme, (4) a memory cell circuit, and the like.

First, as to the type of a memory element of (1), although there may be a case where a sufficient operation margin is not obtained, it is possible to apply the constant verify scheme to any types of memory elements in principle. For instance, the memory element type may be p-channel type/n-channel type, floating gate structure/MNOS structure/silicon cluster (also called "silicon dot") structure, or a memory transistor on an Si substrate. Also, the memory element may be a memory transistor on an SOI substrate or a memory TFT (thin film transistor) on a substrate with an insulating surface.

As to the charge injection/discharge scheme of (2), it is possible to list injection/discharge scheme using a tunnel current (FN injection/discharge scheme) and an injection scheme using a hot electron (HE injection scheme). It is also possible to apply the constant verify scheme of the present invention to any types of injection/discharge schemes so long as it is possible to simultaneously perform a reading operation.

In the case where the HE injection scheme is used, it is possible to know the state of a memory element by referring to the magnitude of a drain current (or a drain voltage). Also, in the case where the FN injection/discharge scheme is used, it is possible to know the state of a memory element with a drain current (or a drain voltage) by applying an appropriate potential difference between a source and a drain. Also, it is possible to use a method with which reading is performed by judging a tunnel current in principle.

Also, as to the reading scheme of (3), it is possible to use a scheme with which a drain current or a drain voltage is read. Needless to say, another reading scheme may be used. Also, as to the memory cell circuit of (4), it is possible to consider various structures such as NOR type/NAND type or a structure in which one or two elements are included in a memory cell. Aside from these, in connection with the reading scheme and the memory cell circuit, it is possible to classify verify schemes into a scheme based on a bit-by-bit operation and verify and into a scheme based on multiple cell (typically, one line) simultaneous operation and bit-by-bit verify. For more detailed information concerning these structures, it is possible to refer to the following embodiment modes and examples.

Next, the constant verify scheme of the present invention will be described in more detail. FIG. 1 shows an example of a circuit diagram illustrating the verify operation according to the present invention, while FIG. 5 shows an example of a timing chart for the verify operation. In the following description, a source voltage, a drain voltage, and a control gate voltage are referred to as Vs, Vd, and Vcg, respectively. Also, it is assumed that writing/erasing and reading are performed at the same time in the case of (Vd, Vcg)=(Vd1, Vcg1) and writing/erasing is not performed in the case of (Vd, Vcg)= (Vd0, Vcg0). The state and period in the case of (Vd, Vcg)= (Vd1, Vcg1) will be respectively referred to as the "operation state" and the "operation period", while the state and period in the case of (Vd, Vcg)=(Vd0, Vcg0) will be respectively referred to as the "non-operation state" and the "non-operation period". Note that Vs remains constant through the operation period and the non-operation period. However, even in a general case where Vs is not constant, it becomes possible to apply the constant verify scheme with an appropriate circuit.

The circuit shown in FIG. 1 includes a selected memory element 101, a sense amplifier 102, a resistor 103, and switches 104 to 108. The source voltage Vs is given to the source region of the memory element 101. Also, the control gate voltage is connected to a word line potential VWL0 or VWL1 via the switch 104. The drain region (whose potential is set to Vd) of the memory element 101 is connected to the resistive element 103 and the remaining terminal of the resistive element 103 is connected to a bit line potential VBL0 or VBL1 via the switch 105. The drain region of the memory element 101 is connected to one of the input terminals (node A) of the sense amplifier 102. The other of the input terminals (node B) of the sense amplifier 102 is connected to a reference voltage Vref0 or Vref1 via the switch 106, and the output from the sense amplifier 102 is connected to a node C via the switches 108 and 107. Also, the potential of the node C is outputted to the outside as the verify signal Sv. The node C is connected to the switches 104, 105, and 106 and performs switching thereof. The switch 108 switches between the output from the sense amplifier 102 and a High signal in accordance with the signal S1, while the switch 107 switches between one terminal of the switch 108 and a Low signal in accordance with the signal S0.

The following description concerns the operations of the switches and sense amplifier constituting the circuit shown in FIG. 1. In the case where the verify signal Sv is High, the switches 104 to 108 are respectively connected to VWL1, VBL1, Vref1, a Low signal, and a High signal. Also, in the case where the verify signal Sv is Low, the switches 104 to 108 are respectively connected to VWL0, VBL0, Vref0, one terminal of the switch 108, and the output from the sense amplifier 102. Also, in the case where the potential of the node A is higher than the potential of the node B, the output from the sense amplifier 102 becomes High. On the other hand, in the case where the potential of the node A is lower than the potential of the node B, the output from the sense amplifier 102 becomes Low.

As a result, the circuit shown in FIG. 1 is placed in an operation state in the case where the verify signal Sv is High, and is placed in a non-operation state in the case where the verify signal Sv is Low. The potential of the verify signal Sv is selected by the signals S0 and S1. In the case where S0 is High and S1 is Low, the verify signal Sv becomes Low. Also, in the case where S0 is Low and S1 is High, the verify signal Sv becomes High. Further, in the case where both of S0 and S1 are Low, the output from the sense amplifier 102 becomes the verify signal Sv.

The sense amplifier 102 compares the drain voltage of the memory element with a reference voltage and outputs a potential in accordance with a relation in magnitude of the voltages. Consequently, in the case where both of S0 and S1 are Low, one of an operation state and a non-operation state is selected in accordance with the output from the sense amplifier 102. As can be seen from this, the circuit shown in FIG. 1 constitutes a feedback circuit in which the verify signal Sv is regarded as a feedback signal.

In the case where the circuit shown in FIG. 1 is regarded as a feedback circuit (S0 and S1 are both Low), each of an operation state and a non-operation state may be in a stable state and an unstable state. The operation state becomes stable in the case where the drain voltage Vd of the memory element is higher than the reference voltage Vref1, and becomes unstable in the case where the drain voltage Vd is lower than the reference voltage Vref1. Also, the non-operation state becomes stable in the case where the drain voltage Vd of the memory element is lower than the reference voltage Vref0, and becomes unstable in the case where the drain voltage Vd is higher than the reference voltage Vref0. In the stable state, the operation state is continued. However, in the unstable state, the shifting to another operation state is performed.

It should be noted here that the resistor 103 is not limited to the resistive element and another circuit may be used so long as the circuit is effectively regarded as a resistor. In addition, although a scheme with which a drain voltage is read is adopted in the circuit shown in FIG. 1, the present invention is not limited to this. A drain current may be read or another publicly known reading method may be applied.

When the circuit described above is used, it becomes possible to perform the constant verify scheme. The following description is explained with reference to the timing chart shown in FIG. 5. The constant verify operation of the present invention is fundamentally constructed of three periods that are (1) a reset period, (2) a first operation period (forced operation period), and (3) a second operation period (constant verify period).

During the reset period of (1), preparations prior to the initiation of a verify operation are conducted. In FIG. 5, S0 is set to a High level and S1 is set to a Low level to obtain a non-operation state. Aside from this, appropriate pre-charging or discharging may be performed in accordance with which operation scheme is used, or the reset period may be omitted.

The first operation period (forced operation period) of (2) is a period in which an operation state is obtained as an initial state of the feedback circuit shown in FIG. 1. In FIG. 5, there is forcedly obtained an operation state by setting S0 to a Low level and S1 to a High level. The forced operation period is required in the case where a non-operation state is stable in defiance of the threshold voltage of a memory element. In the case of a circuit designed so that the non-operation state becomes unstable if the memory element is not in a target state, the forced operation period may be omitted.

The second operation period (constant verify period) of (3) is a period in which a verify operation is performed in accordance with the feedback circuit. The overwhelming majority of a writing/erasing operation is performed in this period. In FIG. 5, the feedback circuit is constructed by setting both of S0 and S1 as Low signals. The constant verify period is set so that an operation state becomes unstable if the memory element is placed in a target state, and the operation state is shifted to a non-operation sate immediately after the memory element is placed into the target state. Note that it is required that a memory element in the target state is stable in the non-operation state.

FIG. 5 also shows an example in which an operation voltage to be inputted, a threshold voltage, and a drain voltage vary with time. In the following description, there will be considered a verify operation by which the threshold voltage Vth of the memory element is set to a threshold voltage Vthref (Vref1=Vd) or higher in an operation state. Also, there will be considered a case of VBL1>Vref1>VBL0=Vs>Vref0, in which drain voltage is increased in an operation state. The variation with time shown in FIG. 5 is just an example and it is possible to perform a verify operation under a condition of VBL1<Vref1<VBL0, VBL0 Vs, or Vref0=Vref1. Also, the threshold voltage of a memory element may be decreased or the drain voltage may be decreased in an operation state. In any event, the idea of the constant verify scheme is the same and the differences do not concern the nature of the present invention.

In FIG. 5, in the case where the initial state of the memory element is Vth<Vthref a condition of Vd<Vref1 is obtained during a forced operation, and the operation state becomes stable. The forced operation period is directly shifted to the constant verify period and the operation state is continued until the threshold voltage Vth of the memory element becomes equal to or higher than Vthref. When a condition of Vd Vref1 is obtained, the verify signal Sv is reversed to obtain a non-operation state. That is, the verify operation is finished. The non-operation state is stable because of Vd=VBL0>Vref0. Note that with the verify scheme described above, the initial state after the reset is Vd=VBL0>Vref0 and the non-operation state is stable, and, therefore, the forced operation period is required.

It should be noted here that in the case where the initial state of the memory element is Vth>Vthref (shown as Sv', Vth', and Vd'), a condition of Vd'>Vref1 is obtained during the forced operation, the verify signal Sv' is reversed immediately after the forced operation period is finished, and there is obtained a non-operation. That is, the verify operation is finished. The non-operation state is stable because a condition of Vd'=VBL0>Vref0 is obtained.

In this case, the threshold voltage of a memory element is unnecessarily increased in the forced operation period. Accordingly, it is preferable that the forced operation period is shortened as much as possible. It is preferable that the forced operation period is equal to or shorter than 1 μsec. Since the object of the forced operation period is to read the state of a memory element as the verify signal, it is appropriate that the forced operation period is minimized within a range in which it is possible to accomplish this object. It is possible to perform the reading operation in a very short time period in comparison with the writing/erasing period, therefore it is substantially possible to set the degree of change in a threshold voltage during the forced operation period to a negligible level. Accordingly, there arises no problem due to the unnecessary increase of the threshold voltage in the forced operation period.

In the manner described above, the constant verify operation of the present invention is performed. The above description concerns an example for explaining a typical verify operation and the present invention is not limited to the circuit diagram and the timing chart diagram shown in FIGS. 1 and 5. In general, the fundamental idea is to use a mechanism, in which an operation state is shifted to a non-operation state when a threshold voltage reaches a target state, and therefore any other circuit may be used so long as the circuit has such a mechanism. That is, it is enough to design the circuit so that the operation state becomes stable if the threshold voltage of a memory element is not in the target state and becomes unstable if the threshold voltage of the memory element is in the target state. Also, the circuit may be designed so that the non-operation state becomes unstable if the memory element is not in the target state and becomes stable if the memory element is in the target state. Alternatively, the circuit may be designed so that a stable state is obtained regardless of the threshold voltage of the memory element.

As described above, according to the present invention, there is realized a verify method with which it is possible to perform high-speed writing/erasing with a narrow distribution width of a threshold voltage. By using such a verify method, there is also realized a nonvolatile memory that is capable of performing high-speed writing/erasing with a narrow distribution width of a threshold voltage. Note that the operation characteristics, such as a high-speed operation and a narrow distribution width of a threshold voltage, are particularly preferable in a multilevel nonvolatile memory.

According to the present invention, there is provided a driving method of a nonvolatile memory, in which during a verify operation, a first operation for changing a threshold voltage of a memory element is performed concurrently with a second operation for judging the threshold voltage of the memory element.

The driving method may be a method, in which at a timing when the threshold voltage of the memory element judged by the second, operation becomes a set voltage, the first operation and the second operation are terminated and the verify operation is finished.

According to the present invention, there is provided a driving method of a nonvolatile memory for setting a threshold voltage of a memory element to a set voltage or higher, in which: during a verify operation, a first operation for increasing the threshold voltage of the memory element is performed concurrently with a second operation for judging a relation in magnitude between the threshold voltage of the memory element and the set voltage: a judgement result of the second operation is outputted as a verify signal; the verify signal takes a first value if the threshold voltage of the memory element is smaller than the set voltage, and takes a second value if the threshold voltage of the memory element is larger than the set voltage; the first operation is performed if the verify signal takes the first value; and is not performed if the verify signal takes the second value; and the first operation and the second operation are terminated and the verify operation is finished when the verify signal changes from the first value to the second value.

According to the present invention, there is provided a driving method of a nonvolatile memory for setting a threshold voltage of a memory element to a set voltage or lower, in which: during a verify operation, a first operation for decreasing the threshold voltage of the memory element is performed concurrently with a second operation for judging a relation in magnitude between the threshold voltage of the memory element and the set voltage; a judgement result of the second operation is outputted as a verify signal; the verify signal takes a first value if the threshold voltage of the memory element is larger than the set voltage, and takes a second value if the threshold voltage of the memory element is smaller than the set voltage; the first operation is performed if the verify signal takes the first value, and is not performed if the verify signal takes the second value; and the first operation and the second operation are terminated and the verify operation is finished when the verify signal changes from the first value to the second value.

According to the present invention, there is provided a driving method of a nonvolatile memory for setting a threshold voltage of a memory element to a set voltage or higher, in which: during a verify operation, a first operation for increasing the threshold voltage of the memory element is performed concurrently with a second operation for judging a relation in magnitude between the threshold voltage of the memory element and the set voltage, the verify operation includes at least a first period and a second period that continues from the first period; a verify signal takes a first value during the first period; a judgment result of the second operation is outputted as the verify signal during the second period; during the second period, the verify signal takes the first value if the threshold voltage of the memory element is smaller than the set voltage, and takes a second value if the threshold voltage of the memory element is larger than the set voltage; the first operation is performed if the verify signal takes the first value, and is not performed if the verify signal takes the second value; and the first operation and the second operation are terminated and the verify operation is finished when the verify signal changes from the first value to the second value.

According to the present invention, there is provided a driving method of a nonvolatile memory for setting a threshold voltage of a memory element to a set voltage or lower, in which: during a verify operation, a first operation for decreasing the threshold voltage of the memory element is performed concurrently with a second operation for judging a relation in magnitude between the threshold voltage of the memory element and the set voltage; the verify operation includes at least a first period and a second period that continues from the first period; a verify signal takes a first value during the first period; a judgment result of the second operation is outputted as the verify signal during the second period; during the second period, the verify signal takes the first value if the threshold voltage of the memory element is larger than the set voltage, and takes a second value if the threshold voltage of the memory element is smaller than the set voltage; the first operation is performed if the verify signal takes the first value, and is not performed if the verify signal takes the second value; and the first operation and the second operation are terminated and the verify operation is finished when the verify signal changes from the first value to the second value.

According to the present invention, there is provided a nonvolatile memory that performs a verify operation, including a means for simultaneously performing a first operation for changing a threshold voltage of a memory element and a second operation for judging the threshold voltage of the memory element.

The nonvolatile memory may further include a means for terminating the first operation and the second operation and finishing the verify operation at a timing when the threshold voltage of the memory element judged by the second operation becomes a set voltage.

According to the present invention, there is provide a nonvolatile memory that performs a verify operation for setting a threshold voltage of a memory element to a set voltage or higher, the nonvolatile memory including: a means for simultaneously performing a first operation for increasing the threshold voltage of the memory element and a second operation for judging a relation in magnitude between the threshold voltage of the memory element and the set voltage; a means for, during the second operation, generating a verify signal that takes a first value if the threshold voltage of the memory element is smaller than the set voltage and takes a second value if the threshold voltage of the memory element is larger than the set voltage; a means for performing the first operation if the verify signal takes the first value, and not performing the first operation if the verify signal takes the second value; and a means for terminating the first operation and the second operation and finishing the verify operation, when the verify signal changes from the first value to the second value.

According to the present invention, there is provided a nonvolatile memory that performs a verify operation for setting a threshold voltage of a memory element to a set voltage or lower, the nonvolatile memory including: a means for simultaneously performing a first operation for decreasing the threshold voltage of the memory element and a second operation for judging a relation in magnitude between the threshold voltage of the memory element and the set voltage; a means for, during the second operation, generating a verify signal that takes a first value if the threshold voltage of the memory element is larger than the set voltage and takes a second value if the threshold voltage of the memory element is smaller than the set voltage; a means for performing the first operation if the verify signal takes the first value, and not performing the first operation if the verify signal takes the second value; and a means for terminating the first operation and the second operation and finishing the verify operation when the verify signal changes from the first value to the second value.

According to the present invention, there is provided a nonvolatile memory that performs a verify operation for setting a threshold voltage of a memory element to a set voltage or higher, the nonvolatile memory including: a means for simultaneously performing a first operation for increasing the threshold voltage of the memory element and a second operation for judging a relation in magnitude between the threshold voltage of the memory element and the set voltage; a means for generating a verify signal that takes a first value during a first period; a means for, during a second period that continues from the first period, generating a verify signal that takes the first value if the threshold voltage of the memory element is smaller than the set voltage and takes a second value if the threshold voltage of the memory element is larger than the set voltage; a means for performing the first operation if the verify signal takes the first value, and not performing the first operation if the verify signal takes the second value; and a means for terminating the first operation and the second operation and finishing the verify operation when the verify signal changes from the first value to the second value.

According to the present invention, there is provided a nonvolatile memory that performs a verify operation for setting a threshold voltage of a memory element to a set voltage or lower, the nonvolatile memory including: a means for simultaneously performing a first operation for decreasing the threshold voltage of the memory element and a second operation for judging a relation in magnitude between the threshold voltage of the memory element and the set voltage; a means for generating a verify signal that takes a first value during a first period; a means for, during a second period that continues from the first period, generating a verify signal that takes the first value if the threshold voltage of the memory element is larger than the set voltage and takes a second value if the threshold voltage of the memory element is smaller than the set voltage; a means for performing the first operation if the verify signal takes the first value, and not performing the first operation if the verify signal takes the second value; and a means for terminating the first operation and the second operation and finishing the verify operation when the verify signal changes from the first value to the second value.

In the nonvolatile memory, the memory element may store multi-state data.

DESCRIPTION OF THE PREFERRED EMBODIMENTS

First Embodiment Mode

Figure 1:
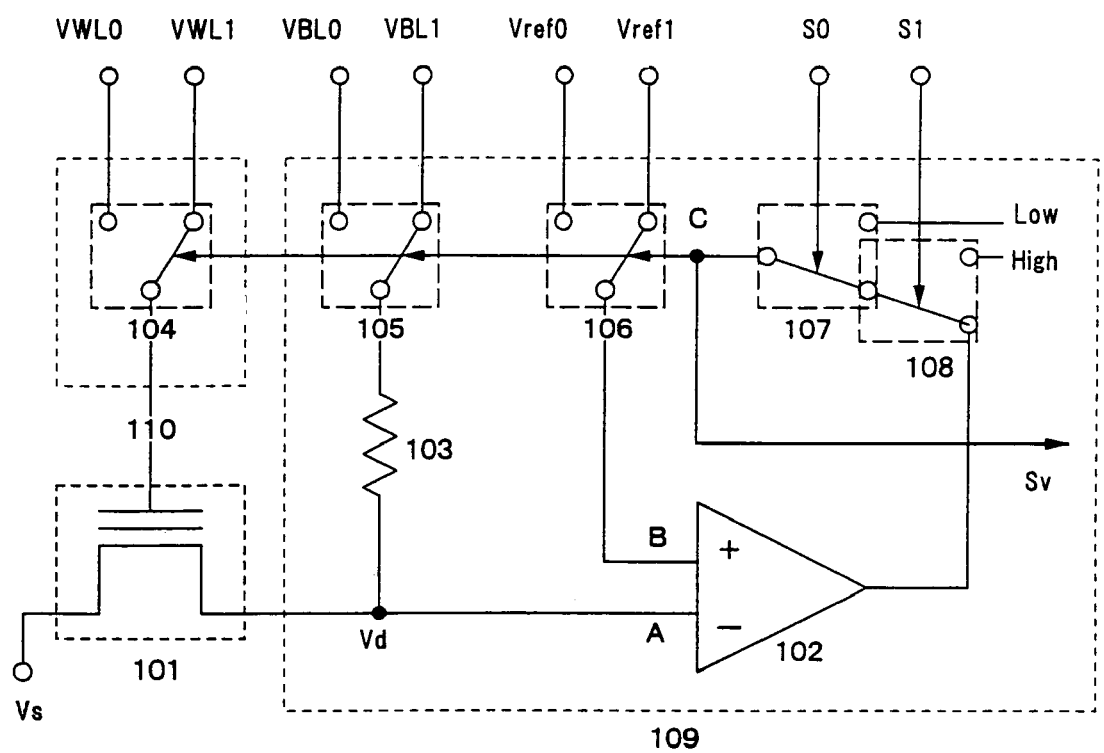
FIG. 1 is circuit diagram illustrating a verify operation of a nonvolatile memory of the present invention.
Figure 2:
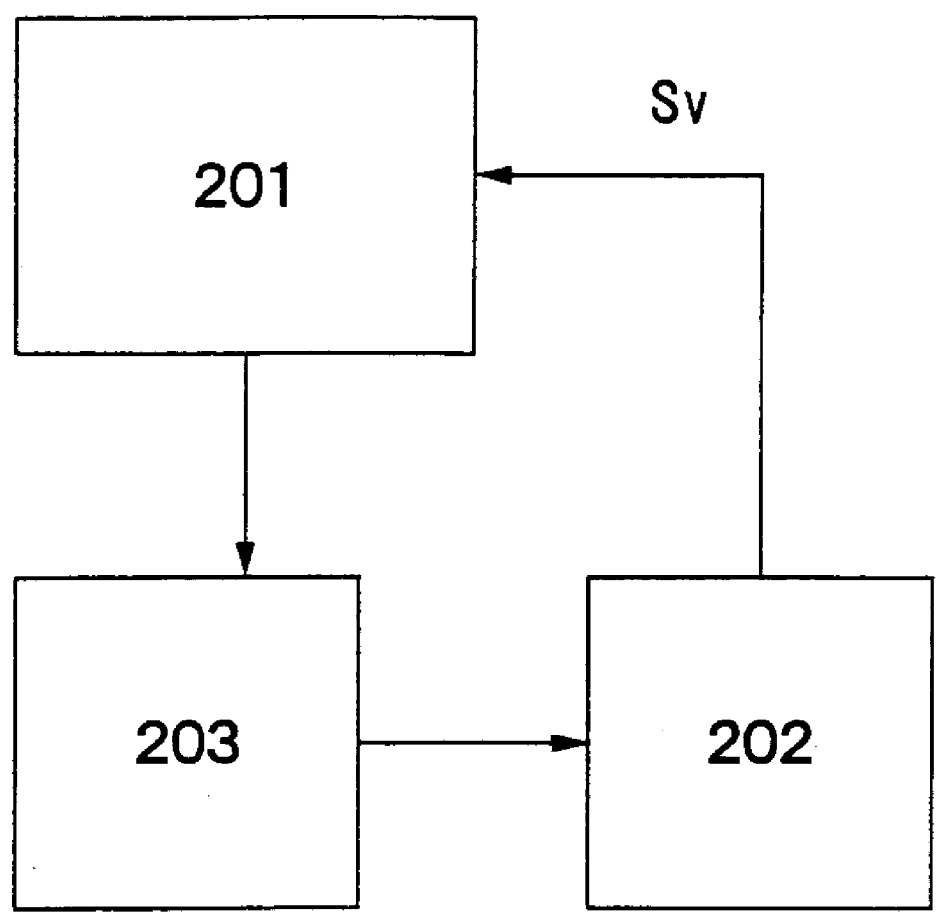
FIG. 2 is a block diagram illustrating a verify operation of a conventional nonvolatile memory.
Figure 3:
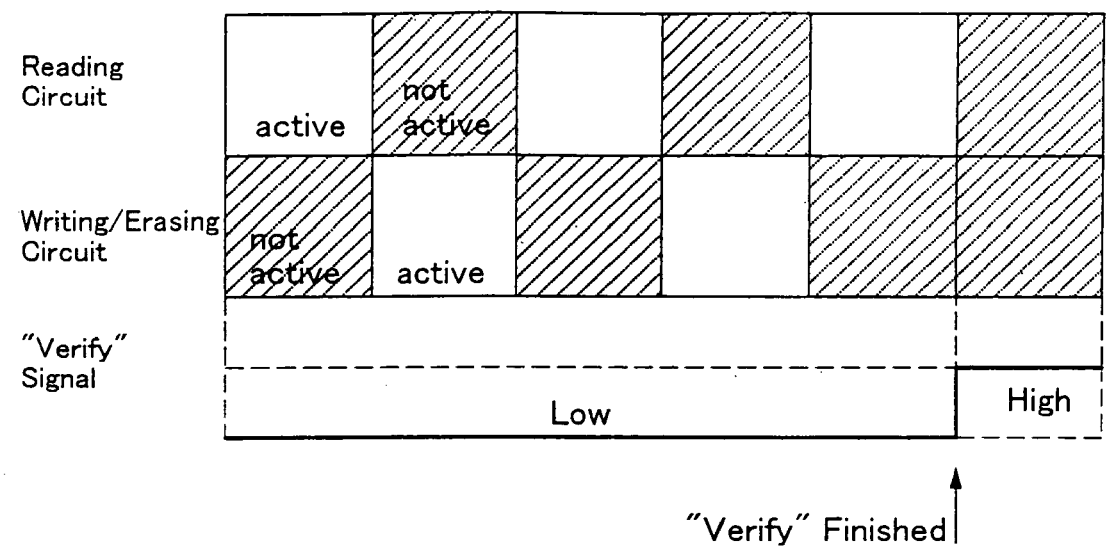
FIG. 3 is a conceptual diagram illustrating the verify operation of the conventional nonvolatile memory.
Figure 4:
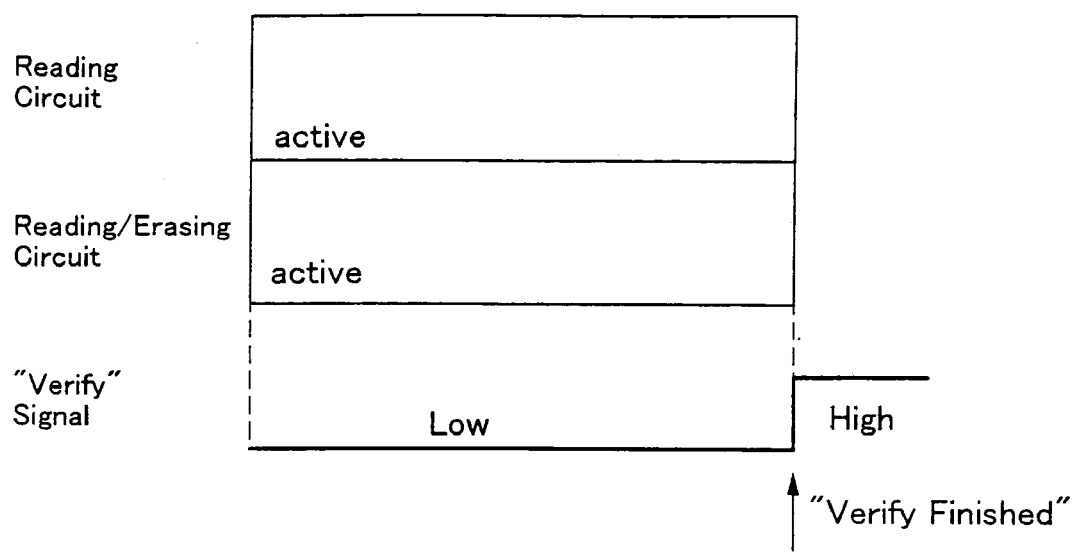
FIG. 4 is a conceptual diagram illustrating the verify operation of the nonvolatile memory of the present invention.

In the above description, there has been explained a typical circuit construction and operation method in the case where a word line voltage and a bit line voltage in an operation state are referred to as (VWL1, VBL1) and a word line voltage and a bit line voltage in a non-operation state are referred to as (VWL0/VBL0) with focusing on a single memory cell. A constant verify scheme of the present invention that is based on the idea described above is applicable to various structures. In the first embodiment mode, there will be, described a structure in which the constant verify scheme is applied to a specific charge injection/discharge scheme in order to implement the nonvolatile memory of the present invention more specifically. Also, in the second embodiment mode, there will be described structures of a memory cell array circuit, an operation circuit, and a verify scheme.

In the first embodiment mode, there will be described a case where the constant verify scheme is applied to a specific writing/erasing scheme. In particular, each scheme will be described with focusing on a case of VWL0=VWL1. In such a case, it becomes possible to perform a parallel operation and bit-by-bit verify for memory cells of one line that share the word line, which enables a still higher-speed operation through parallelization (second embodiment mode).

As an operation scheme, there may be listed three schemes that are a hot electron injection scheme (HE injection scheme), an injection scheme (an FN injection scheme) and a discharge scheme (an FN discharge scheme) using a tunnel current (a Fowler-Nordheim current, an FN current). In the following description, the reference voltage in an operation state and the reference voltage in a non-operation state are respectively referred to as Vref1 and Verf0, and the source potential in an operation state and the source potential in a non-operation state are both referred to as Vs.

The HE injection scheme is a scheme with which hot electrons generated by a high electric field in the vicinity of a drain region are injected into a charge accumulation layer by a control gate potential. This scheme is carried out by applying a high voltage to the drain region and a control gate electrode. In the case of a conventional. HE injection scheme, for instance, Vs is set to GND, Vd is set to 5 V, and Vcg is set to 10 V.

With the HE injection scheme described above, an on-current flows through a memory element, and therefore it becomes possible to know the state of the memory element using a drain current. In this case, by using the circuit shown in FIG. 1 as it is, it becomes possible to carry out the constant verify scheme of the present invention.

For instance, voltages in an operation state are set as VLB1=7 V, VWL1=10 V, and Vref1=5 V. Also, voltages in a non-operation state are set as VBL0=0 V, VWL0=0 V. and Vref0=1 V. In this case, the HE injection is performed until the threshold voltage of the memory element reaches a threshold voltage Vthref (2.5 V, for instance) at which the drain voltage Vd becomes the same as Vref1 (=5 V).

Figure 6:
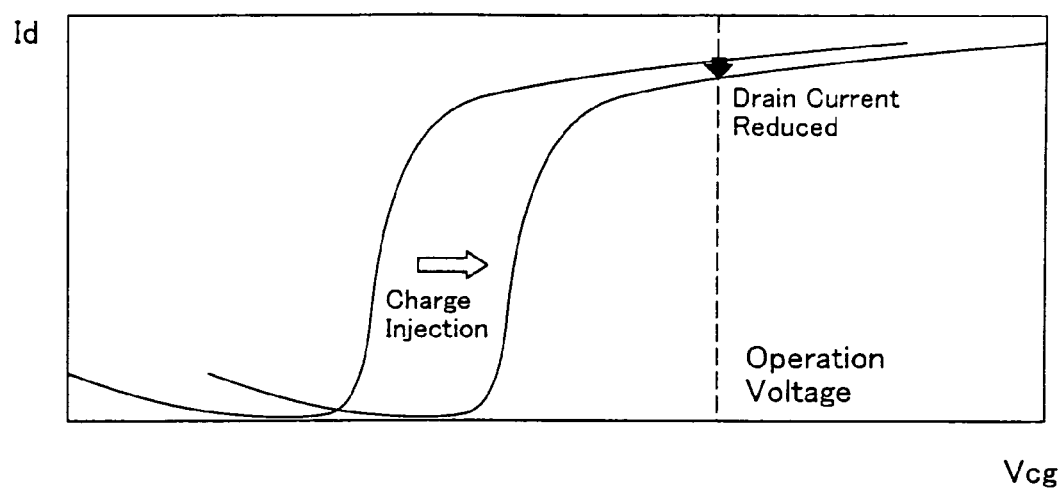
FIG. 6 shows a manner in which a VcgId characteristic changes due to charge injection.
Figure 8:
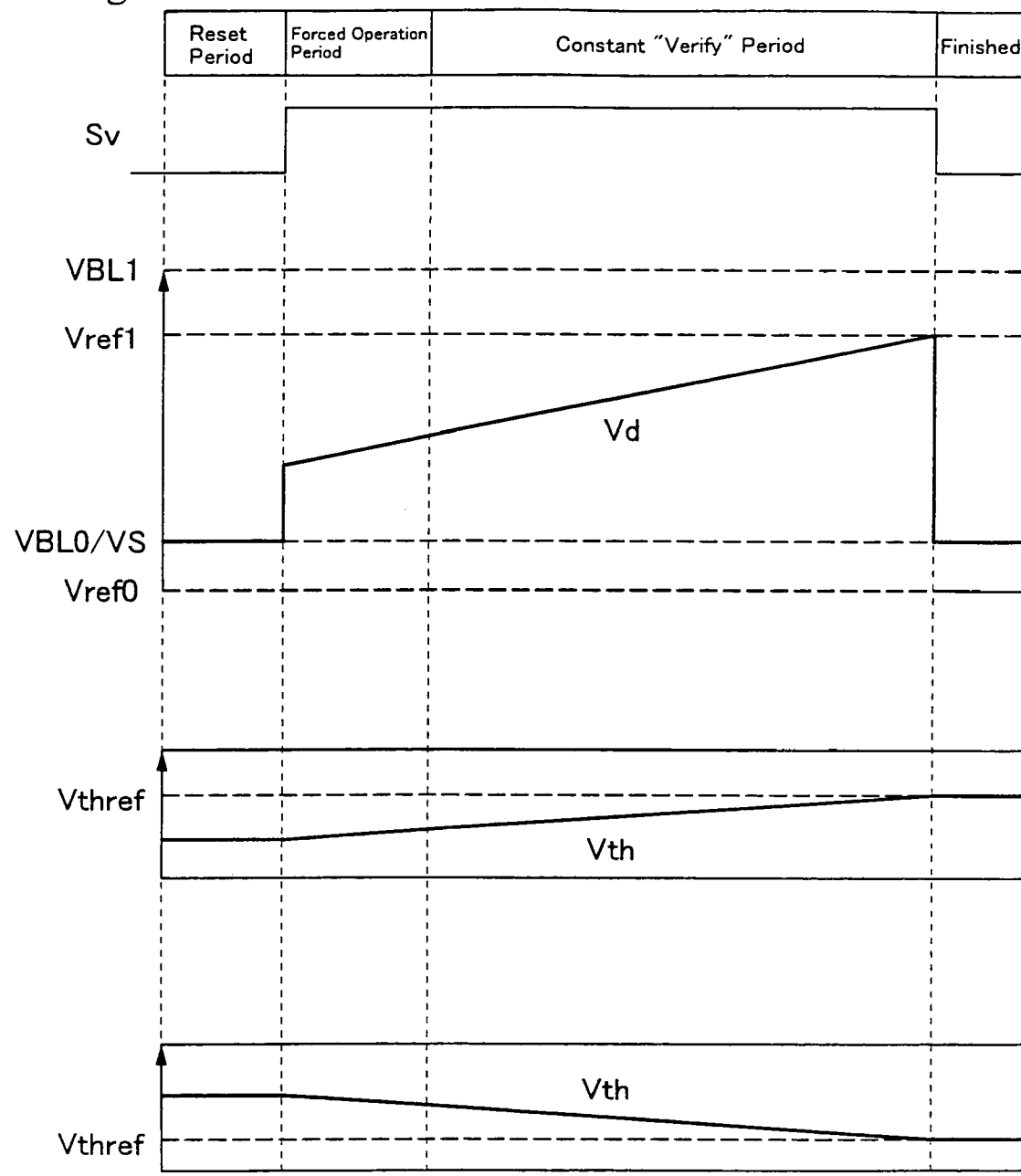
FIG 8 is timing charts illustrating the verify operation of the nonvolatile memory of the present invention.

This state is shown in FIG. 6 and FIGS. 8A and 8B. FIG. 6 shows a manner in which a control gate voltage-drain current characteristic (hereinafter referred to as the "VcgId characteristic") of a memory element changes due to the HE injection. With the HE injection, the threshold voltage of the memory element is increased and the VcgId characteristic moves parallel rightward, so that the practical resistance of the memory element is increased. FIGS. 8A and 8B respectively show typical changes with time of the threshold voltage Vth and the drain voltage Vd. In the case where an initial state is Vth<Vthref, a state of Vd<Vref1 is obtained during a forced operation period and an operation state continues as it is. During a constant verify period, in conjunction with the HE injection, the practical resistance of the memory element is increased and Vd is also increased. In due time, when a state of Vd Vref1 is obtained, a verify judgement signal SV is reversed. Also, a word line potential, a bit line potential, and a reference potential are switched and the constant verify operation is finished.

In particular, it is also possible to set the voltages in an operation state and a non-operation state as VWL0=VWL1. For instance, the voltages in the operation state are set as VBL1=7 V, VWL1=10 V, and Vref1=5 V, while the voltages in the non-operation state are set as VBL0=0 V, VWL0=10 V, and Vref0=1 V. In this case, like in the aforementioned case, the HE injection is performed until the threshold voltage of the memory element reaches a threshold voltage Vthref (2.5 V, for instance) at which the drain voltage Vd becomes the same as Vref1 (=5 V). Note that although a stress is caused by VWL0 even in a non-operation state in the case of VWL0=VWL1, it is required that there hardly occurs charge injection due to this stress. In general, an operation margin is decreased when the voltages are set as VWL0=VWL1, so that it is required to appropriately set an operation voltage so that misoperations are prevented.

The FN injection scheme is a scheme with which a tunnel current is allowed to flow through a tunnel oxidation film by applying a positive high voltage to a control gate electrode to inject electrons into a charge accumulation layer from the entire region of a channel. With a conventional FN injection scheme, for instance, there are obtained conditions of Vs=Vd=GND, a substrate potential Vsub=GND, and Vcg=12 V. Note that for the purpose of alleviating stresses on other memory cells, reducing a consumed current, and the like, there may be a case where Vs and Vd are placed in floating states.

Since a source and a drain have the same potential with a conventional FN injection scheme, it is impossible to know the state of a memory element if no changes are made. As a method of applying the constant verify scheme, a minute potential difference is given between the source and the drain and the state of the memory element is judged by a drain current in this embodiment mode. In this case, it is also possible to use the circuit shown in FIG. 1 as it is. Note that for the purpose of suppressing a consumed current, it is preferable that the potential difference between the source and the drain is reduced within a range in which it is possible to perform reading with a required degree of precision.

For instance, it is enough that voltages in an operation state are set as VBL1=1 V. VWL1=12 V, and Vref1=0.5 V and voltages in a non-operation state are set as VBL0=0 V, VWL0=0 V, and Vref0=0.5 V. In this case, a tunnel current flows at a source side and the FN injection is performed until the threshold voltage of the memory element reaches a threshold voltage Vthref (2.5 V, for instance) at which the drain voltage Vd becomes the same as Vref1 (=0.5 V).

A manner in which the VcgId characteristic varies due to the FN injection scheme and the typical manners in which the threshold voltage Vth and the drain voltage Vd vary with time are basically the same as those in the case of the HE injection scheme, and are respectively expressed by FIG. 6 and FIGS. 8A and 8B.

Also, it is possible to set the voltages in an operation state and a non-operation state as VWL0=VWL1. In this case, the drain voltages in the operation state and the non-operation state are set to Vd1 and Vd0, and FN injection is caused by a potential difference of VWL1 Vd1. However, it is required to perform setting so that there occurs no FN injection at a potential difference of VWL1 Vd0. The FN injection is performed from a drain electrode side. For instance, there arises no problem if VWL0=VWL1=10 V, VBL1/VBL0=2/0 V, and Vref1/Vref0=1/1 are set and a circuit obtained by reversing the output of the sense amplifier of the circuit shown in FIG. 1 is used.

The FN discharge scheme utilizes a tunnel current whose direction is opposite to that in the case of the FN injection scheme. In the case where electrons are pulled out to a substrate, a substrate potential Vsub is increased. On the other hand, in the case where electrons are pulled out to a source region or a drain region, a source voltage Vs or a drain voltage Vd is increased. With the conventional FN discharge scheme, for instance, the voltages are set as Vs=Vd=(floating state), Vsub=12 V, and Vcg=0 V in the case where electrons are pulled out to the substrate. Also, in the case where electrons are pulled out to the drain side, the voltages are set as Vs= (floating state), Vsub=0 V, Vcg=9 V, and Vd=3V. In the latter case, it is preferable that the drain voltage is suppressed as much as possible to suppress a current between the substrate and the drain.

With the conventional FN discharge scheme, a source and a drain have the same potential, and therefore it is impossible to know the state of the memory element if no changes are made. As a method of applying the constant verify scheme, an appropriate potential difference is given between the source and the drain and the state of the memory element is judged by a drain current in this embodiment mode. In this case, it is also possible to use the circuit shown in FIG. 1. Note that an n-channel type memory element is placed in an OFF state during FN discharge, an off-current is read. Accordingly, a consumed current becomes small. For the purpose of performing precise reading, it is preferable that the potential difference between the source and the drain is increased to a level at which no hot carrier occurs.

For instance, Vs is set to 0 V, voltages in an operation state are set as VBL1=5 V. VWL1=9 V, and Vref1=4 V, and voltages in a non-operation state are set as VBL0=0 V. VWL0=0 V, and Vref0=1 V. In this case, a tunnel current flows at the drain side and the FN discharge is performed until the threshold voltage of the memory element reaches a voltage Vthref (1.5 V, for instance) at which the drain voltage Vd becomes the same as Vref1 (=4 V).

Figure 7:
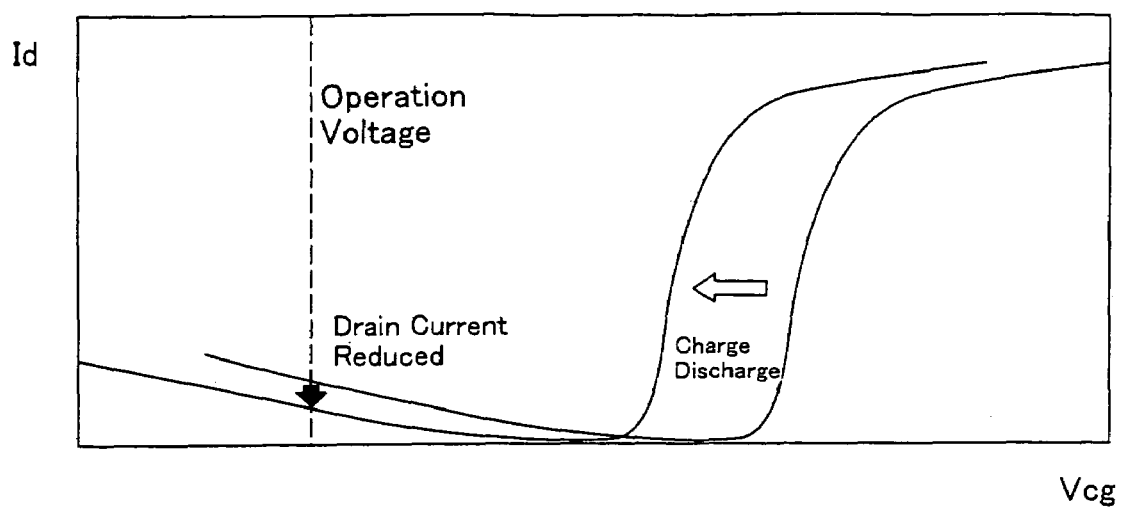
FIG. 7 shows a manner in which the VcgId characteristic changes due to charge discharge.

FIG. 7 shows a manner in which the VcgId characteristic of a memory element varies due to the FN discharge scheme. As can be seen from the figure, the threshold voltage of a memory element is decreased (moves parallel leftward) by the FN discharge scheme, and therefore the off-current of the memory element is decreased and the practical resistance value is increased. As a result, the typical manner in which the threshold voltage Vth and the drain voltage Vd vary with time are expressed by FIGS. 8A and 8C.

Also, it is possible to set the voltages in an operation state and a non-operation state as VWL0=VWL1. In this case, the drain voltages in the operation state and the non-operation state are respectively set to Vd1 and Vd0, and FN discharge is caused by a potential difference of VWL1 Vd1. However, it is required to perform setting so that no FN discharge occurs at a potential difference of VWL1 Vd0. Note that during discharging, FN discharge is performed from the drain side. For instance, the voltages are set as VWL0=VWL1=9 V, VBL1=5 V, VBL0=0 V, Vref1=4 V, and Vref0=1 V.

Structures in which the constant verify scheme of the present invention is applied to the three operation schemes have been described above. In particular, in the case of VWL0=VWL1, as will be described in the second embodiment mode, it becomes possible to perform a one-line simultaneous operation and a bit-by-bit verify operation. This case is preferable because there is achieved a high-speed operation and a threshold voltage distribution with a narrow distribution width. However, in the case where a parallel operation is performed, it is required that a consumed current falls within a range of driving capability of a circuit that writes a signal into a memory cell.

It should be noted here that, although two reference voltages Vref0 and Vref1 are prepared in this first embodiment mode, it is also possible to set Vref0 and Vref1 as the same potential by modifying the reading circuit (refer to the following first and second embodiments).

Also, with the FN injection/discharge scheme, it is also possible in principle to know the state of a memory element by judging a tunnel current. In reality, however, it is difficult to judge the tunnel current because this tunnel current is very small. However, if it becomes possible to read a precise state of a memory element by modifying the reading circuit, this method may also be adopted. In this case, it is not required to provide a potential difference between a source and a drain.

Second Embodiment Mode

In the first embodiment mode, there have been concretely described the charge injection/discharge scheme. In this second embodiment mode, there will be described the construction of a memory cell array circuit and an operation circuit, and a verify scheme in the case where the charge injection/discharge scheme is adopted.

When memory cell arrays are classified, it is possible to broadly classify the memory cell arrays into a NOR type, in which memory elements are connected in parallel, and a NAND type, in which memory elements are connected in series. Also, in a NOR type flash memory that performs batch erasing, each memory cell is composed of one element (one element/memory cell scheme). In a NOR type EEPROM in which it is possible to perform erasing for each bit, each memory cell is composed of two elements that are a memory element and a selection transistor (two elements/memory cell scheme). The latter memory cell realizes high performance by providing a selection transistor in each memory cell. The present invention is applicable to both of the NOR type circuit construction and the NAND type circuit construction in principle. The following description will be limited to the NOR type. As to the NAND type, it is possible to refer to the following third embodiment. Also, it is possible to apply the present invention to the two elements/memory cell scheme with which it is possible to perform bit-by-bit erasing.

Meanwhile, if verify schemes are classified, there may be considered, as representative examples, (1) one-bit operation and verify, (2) one-line operation and verify, and (3) one-line operation and bit-by-bit verify. As to the construction of the operation circuit, it is basically possible to use the circuit construction described with reference to FIG. 1. However, the structure varies to some extent depending on which verify scheme is applied. In the following description, there will be explained each verify scheme and there will also be explained the construction of a nonvolatile memory that uses a corresponding NOR-type memory cell array. Note that, although the circuit construction shown in FIG. 1 is used in this second embodiment mode, there arises no problem even if another circuit construction is used so long as the circuit is capable of carrying out the constant verify operation of the present invention.

The verify scheme of (1) is a scheme with which writing/erasing and verify are performed for one selected memory cell. With this scheme, verify is performed for each bit, so that it is possible realize a narrow distribution width of a threshold voltage. For instance, it is possible to consider the block diagram of a nonvolatile memory shown in FIG. 9.

Figure 9:
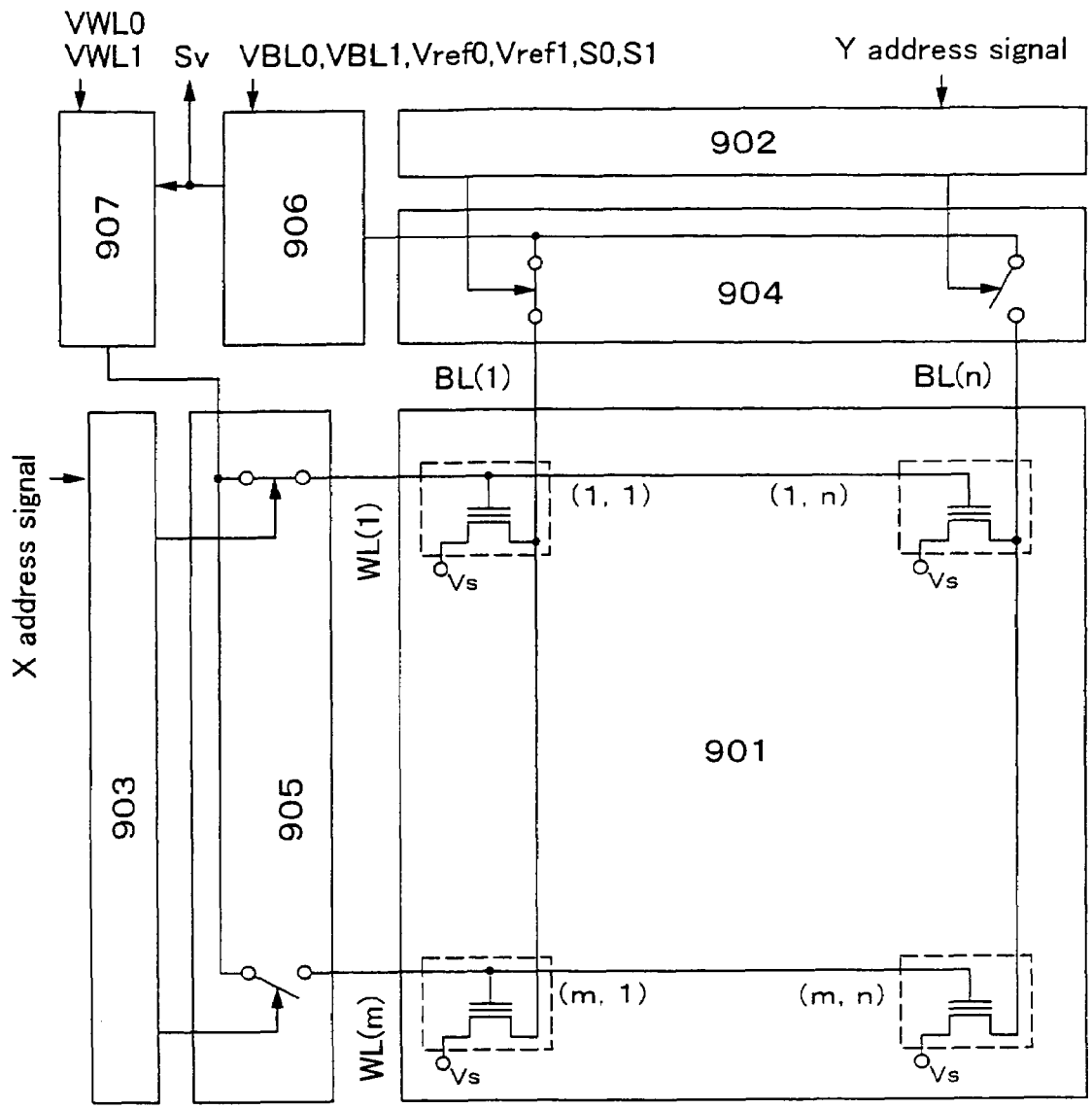
FIG. 9 is a block diagram of the nonvolatile memory of the present invention.

The block diagram of the NOR-type nonvolatile memory shown in FIG. 9 is constructed of a memory cell array 901 in which memory cells that each includes one memory element are arranged in an m-lines by n-rows matrix manner (m and n are each an integer at least equal to one), a Y selector 904, an X selector 905, a Y address decoder 902, an X address decoder 903, and operation circuits 906 and 907. In FIG. 9, there are shown memory cells (1, 1), (1, n), (m, 1) and (m, n) at four corners among the m by n memory cells. In the memory cell array 901, the drain regions of memory elements constituting the m memory cells in the i-th row (i is an integer between one and n inclusive) are connected to the ith bit line BL (i). Also, the j-th word-line WL (j) is connected to the control gate electrodes of memory elements constituting n memory cells in the j-th line (j is an integer between one and m inclusive). Also, a common source potential Vs is given to the source regions of all memory elements. The Y address decoder 902 selects one of n bit lines by inputting a Y address signal. The Y selector 904 gives the selected bit line a bit line potential outputted from the operation circuit 906. In a like manner, the X address decoder 903 selects one of the m word lines by inputting an X address signal. The X selector 905 gives the selected word line a word line potential outputted from the operation circuit 907. It is possible to use circuits that are similar to the operation circuits 109 and 110 shown in FIG. 1 as the operation circuits 906 and 907. The operation circuit 906 receives VBL0, VBL1, Vref0, Verf1, S0, S1, and the like, and outputs the bit line potential and the verify signal Sv. The operation circuit 907 receives VWL0, VWL1, the verify signal Sv, and the like and outputs the word line potential.

In the case of using the block diagram shown in FIG. 9, it is possible to perform the constant verify operation using the scheme of (1). In particular, it is possible to freely determine the word line potentials VWL1 and VWL0 in an operation state and a non-operation state. For instance, in the case of performing a constant verify operation for a memory cell (j, i), the bit line potential is given to the bit line BL (i) by the Y address decoder 902 and the Y selector 904, and the word line potential is given to the word line WL (j) by the X address decoder 903 and the X selector 905. Under a condition where the memory cell (j, i) is selected, a circuit constructed of the memory cell (j, i) and the operation circuits 906 and 907 has a circuit construction that is similar to that shown in FIG. 1 and it is possible to perform the constant verify scheme that has already been described. Needless to say, it is required that no problem is caused by drain disturb in not-selected memory cells in the i-th row and by gate disturb in not-selected memory cells in the j-th row.

The verify scheme of (3) is a scheme with which constant verify is independently performed for each memory cell in a selected line. That is, bit-by-bit verify is performed, so that there is realized a narrow distribution width of a threshold voltage. Also, there is realized a high-speed operation by means of a parallel operation. For instance, it is possible to consider the block diagram of a nonvolatile memory shown in FIG. 10.

Figure 10:
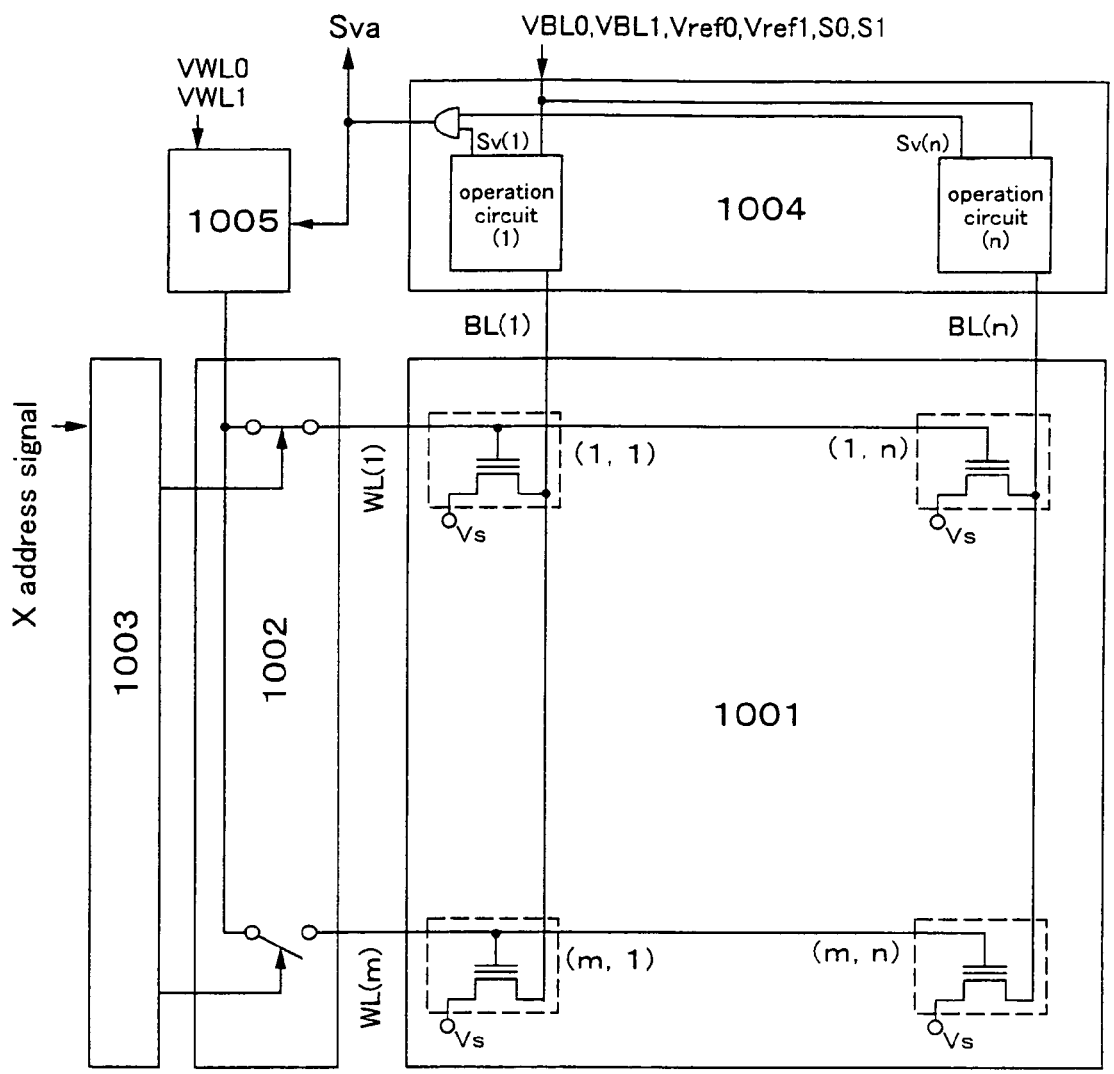
FIG. 10 is a block diagram of the nonvolatile memory of the present invention.

The block diagram of the NOR-type nonvolatile memory shown in FIG. 10 is constructed of a memory cell array 1001 in which memory cells that each includes one memory element are arranged in an m-lines by n-rows matrix manner (m and n are integers equal to more than one), an X selector 1002, an X address decoder 1003, a bit line driving circuit 1004 including operation circuits (1) to (n), and an operation circuit 1005. In FIG. 10, there are shown memory cells (1, 1), (1, n), (m, 1) and (m, n) at four corners among the m by n memory cells. In the memory cell array 1001, the drain regions of memory elements constituting the m memory cells in the i-th row (i is an integer between one and n inclusive) are connected to the ith bit line BL (i). Also, the j-th word line WL (j) is connected to the control gate electrodes of memory elements constituting n memory cells in the j-th line (j is an integer between one and m inclusive). Also, a common source potential Vs is given to the source regions of all memory elements. The X address decoder 1003 selects one of m word lines by inputting an X address signal. The X selector 1002 gives the selected word line a word line potential outputted from the operation circuit 1005. It is possible to use a circuit that is similar to the operation circuit 109 shown in FIG. 1 for each of the n operation circuits (1) to (n) constituting the bit line driving circuit 1004. The n operation circuits (1) to (n) receive common signals that are VBL0, VBL1, Vref0, Verf1, S0, S1, and the like. Also, each of the n operation circuits outputs a bit line potential and one of verify signals Sv (1) to (n). Also, it is possible to use a circuit that is similar to the operation circuit 110 shown in FIG. 1 as the operation circuit 1005. The operation circuit 1005 receives VWL0, VWL1, Sva, and the like and outputs a word line potential. Note that the verify signal Sva is a signal obtained by ANDing verify signals Sv (1) to (n).

In the case of using the block diagram shown in FIG. 10, it is possible to use the verify scheme of (3). For instance, in the case of performing the constant verify operation for the j-th line, the word line potential VWL1 is given to the word line WL (j) by the X address decoder 1003 and the X selector 1002. Each memory cell in each row independently has an operation circuit, which makes it possible to independently perform the constant verify operation for each memory cell. However, the word line potential VWL1 is common among n memory cells, so that it is required to perform the constant verify scheme in which a condition of VWL1=VWL0 is satisfied. Then, when the constant verify operation for one memory cell is finished, a corresponding verify signal Sv (i) becomes High. When the verify operation is finished for all memory cells in one line, the verify signal Sva becomes High.

It is also effective that the word line potential is changed to the potential VWL0 with a small stress by referring to the verify signal Sva. Needless to say, it is required that no problem is caused by drain disturb in the memory cells in lines except the j-th line. It is also required that the consumed current for the one-line operation does not exceed a drivable current. The verify scheme of (3) is capable of realizing a high-speed operation and a threshold voltage distribution with a narrow distribution width, so that it is preferable that this verify scheme is adopted in the case where it is possible to perform the constant verify scheme that satisfies a condition of VWL1=VWL0.

The verify scheme of (2) is a scheme with which writing erasing of all memory cells in one selected line is performed until verifying for all the memory cells in the selected line is finished. This verify scheme is capable of realizing a high-speed operation by means of a parallel operation. As a block diagram, for instance, it is possible to refer to the block diagram of the nonvolatile memory shown in FIG. 10 for the description of the verify scheme of (3). In the verify scheme of (2), it is enough that the potentials of n bit lines are switched from VBL1 to VBL0 when the verify signal Sva becomes High in the block diagram of a nonvolatile memory shown in FIG. 10. Consequently, it is enough that each operation circuit (i) refers to the verify signal Sva instead of referring to the verify signal Sv (i). Alternatively, it is also preferable that the distribution width of a threshold voltage after verifying is narrowed by performing the constant verify operation described in accordance with the verify scheme of (3) as it is and by setting VBL0 so that writing/erasing by (VWL1, VBL0) becomes weaker than writing/erasing by (VWL1, VBL1). Needless to say, it is required that no problem is caused by drain disturb in memory cells in lines except the j-th line and a consumed current required for one-line operation does not exceed a driving capability.

In addition, it is possible to perform the constant verify operation that uses the scheme of (3) and is capable of freely setting VWL1 and VWL0 by adopting a memory cell array with the two elements/memory cell scheme in which word lines and bit lines are provided in parallel. Examples of such a memory cell array circuit and a writing/erasing circuit are Shown in FIG. 11.

Figure 11:
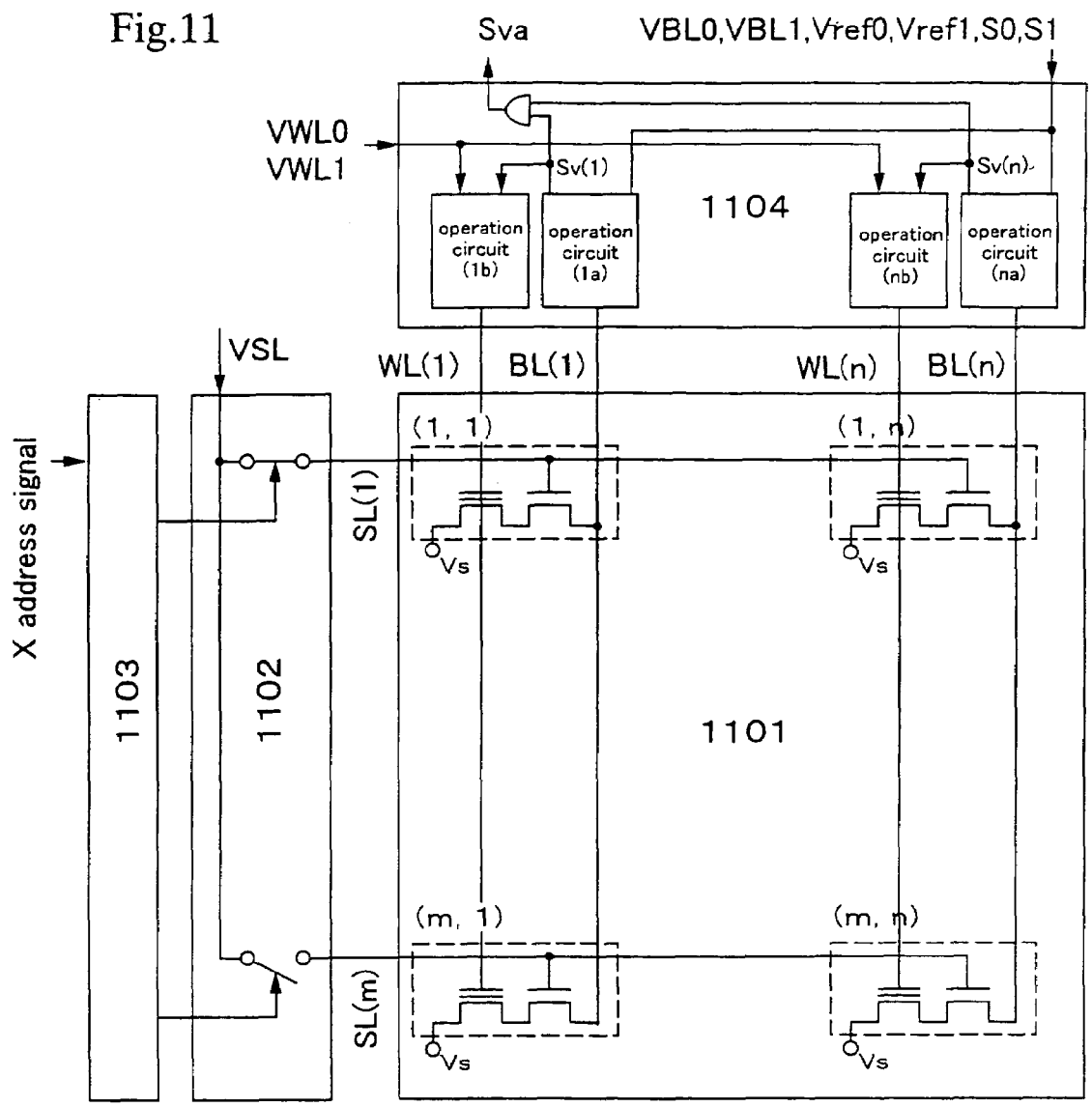
FIG. 11 is a block diagram of the nonvolatile memory of the present invention.

The block diagram of the NOR-type nonvolatile memory shown in FIG. 11 is constructed of a memory cell array 1101 in which memory cells that each includes one memory element and one selection transistor are arranged in an m-line by n-row matrix manner (m and n are integers equal to or more than one), an X selector 1102, an X address decoder 1103, operation circuits (1a) to (na), and a bit line driving circuit 1104 including operation circuits (1b) to (nb). In FIG. 11, there are shown memory cells (1, 1), (1, n), (m, 1) and (m, n) at four corners among the m by n memory cells. In the memory cell array 1101, the drain regions of selection transistors constituting the m memory cells in the i-th row (i is an integer between one and n inclusive) are connected to the i-th bit line BL (i). Also, the i-th word line WL (i) is connected to the control gate electrodes of memory elements constituting the m memory cells in the i-th row (i is an integer between one and n inclusive). Also, the j-th selection line SL (j) is connected to gate electrodes of selection transistors constituting n memory cells in the j-th line j is an integer between one and m inclusive). A common source potential Vs is given to the source regions of all memory elements. The source region of a selection transistor constituting each memory cell is connected to the drain region of a memory element. The X address decoder 1103 selects one of m selection lines by inputting an X address signal. The X selector 1102 gives the selected selection line a selection line potential VSL, thereby placing the selection transistor in an ON state. It is possible to use a circuit that is similar to the operation circuit 109 shown in FIG. 1 for each of the n operation circuits (1a) to (na) constituting the bit line driving circuit 1104. It is also possible to use a circuit that is similar to the operation circuit 110 shown in FIG. 1 for each of the n operation circuits (1b) to (nb) constituting the bit line driving circuit 1104. Each of the n driving circuits (1a) to (na) receives common signals that are VBL0, VBL1, Vref0, Verf1, S0, and S1, and outputs a bit line potential and one of verify signals Sv (1) to (n). Also, each of the n operation circuits (1b) to (nb) receives common voltages VWL0 and VWL1 and respective verify signals Sv (1) to (n), and outputs a word line potential. Note that the verify signal Sva is a signal obtained by ANDing the verify signals Sv (1) to (n).

In the case of using the block diagram shown in FIG. 11, it is possible to use the verify scheme of (3). In addition, it is possible to perform the constant verify operation that is capable of freely setting VWL1 and VWL0. In the case of performing the constant verify operation for the j-th line, for instance, a selection line potential VSL (j) is given to the selection line SL (j) by the X address decoder 1103 and the X selector 1102. Consequently, the selection transistors in the selected line are placed in ON states and the selection transistors in the not-selected lines are placed in OFF states. In the circuit constructed of the selected line and the bit line driving circuit 1104, n circuits which have the circuit construction shown in FIG. 1 are arranged and common signals are input. Therefore, it is possible to independently perform the constant verify operation for each row. It is possible to know that the verify operation is finished by referring to Sva obtained by ANDing the verify signals Sv (1) to Sv (n) outputted from the operation circuits (1a) to (na). Needless to say, it is required that no problem is caused by gate disturb in the memory cells in lines except the j-th line. It is also required that the consumed current required for the one-line operation does not exceed a drivable current.

In the first embodiment mode, there have been described that the constant verify scheme of the present invention is applicable to any one of the HE injection scheme, the FN injection scheme, and the FN discharge scheme and that a scheme that satisfies a condition of VWL1=VWL0 is also applicable. However, the constant verify scheme that satisfies the condition of VWL1=VLW0 is inferior in operation margin to the case where it is possible to freely set VWL1 and VWL0. Therefore, it is preferable that an operation voltage is optimized in accordance with the size and performance of each memory element. Also, in the second embodiment mode, it has been described that the constant verify scheme of the present invention is applied to the three types of verify schemes. By combining with these schemes, it becomes possible to implement various structures as a nonvolatile memory that uses the constant verify scheme of the present invention.

For instance, as a structure of the nonvolatile memory of the present invention, it is possible to implement a structure, in which the constant verify scheme that satisfies the condition of VWL1=VWL0 is adopted and the verify operation of (3) is performed, in both of the charge injection scheme and the discharge scheme. In this case, a high-speed operation is realized by a parallel operation and a narrow distribution width of a threshold voltage by the bit-by-bit verify is also achieved. As a circuit diagram, it is possible to adopt the circuit diagram shown in FIG. 10. As to an example in which the verify scheme like this is used, it is possible to refer to the following first and second embodiments.

Also, for instance, as another structure of the nonvolatile memory of the present invention, it is possible to implement a structure, in which the constant verify scheme that satisfies the condition of VLW1=VLW0 is adopted and the verify operation of (3) is performed, in one of the charge injection scheme and the discharge scheme. This structure is applied to a writing operation, while a conventional batch erasing operation is, for instance, adopted for an erasing operation. In this case, if weak verify writing is performed after the batch erasing, it becomes possible to narrow the distribution width of a threshold voltage in an erase state. As a circuit diagram, it is possible to adopt the circuit diagram shown in FIG. 10. It is possible to carry out the verify scheme like this by adopting the batch erasing in the structure described above. It is also possible to carry out the verify scheme of (3) even in the case where only one of the charge injection and the charge discharge is adoptable.

It should be noted here that it is also effective that a method with which bit lines are grouped into main bit lines and sub-bit lines which are connected by selection transistors, or a method with which source lines are grouped into main source lines and sub-source lines which are connected by selection transistors, is adopted in order to widen an operation margin of the constant verify scheme that satisfies the condition of VWL1=VWL0. As an example of such a circuit construction, it is possible to refer to the following second embodiment.

Also, it is effective that the scheme of (1) or (2) is selected as the constant verify scheme of the present invention. In this case, it is possible to freely set VWL1 and VWL0, so that it becomes possible to maintain a wide operation margin regardless of which injection/discharge scheme is adopted. As a circuit diagram, the circuit diagram shown in FIG. 9 or 10 may be adopted.

It should be noted here that these examples are just a few examples of embodiment modes of the present invention. The constant verify scheme of the present invention is not limited to these examples, and is widely applicable to combinations of the various structures described above. Also, by using the constant verify scheme of the present invention, there is realized a nonvolatile memory that is capable of performing high-speed writing/erasing with a narrow distribution width of a threshold voltage.

EMBODIMENTS

Embodiments of the present invention will be described below.

First Embodiment

There will be described an embodiment in which the constant verify scheme of the present invention is applied to a binary NOR-type nonvolatile memory constructed of n-channel type memory elements. In this embodiment, there will be described a case where there are adopted the one-line simultaneous writing and bit-by-bit verify scheme by the HE injection and the one-line simultaneous erasing and bit-by-bit verify scheme by the FN discharge.

As an example of the block circuit diagram of the nonvolatile memory of this embodiment, it is possible to use the block circuit diagram in FIG. 10 that has been described in the above embodiment mode. Accordingly, there will be omitted the description of the circuit constructions of the memory cell array 1001, the X selector 1002, and the X address decoder 1003. The bit line driving circuit 1004 that has the operation circuits (1) to (n) and the operation circuit 1005 will be described after the description of operation voltages.

First, examples of the operation voltages during writing/erasing, and reading will be summarized in Table 1 given below.

TABLE 1

| | HE writing | FN erasing | Reading |
|---|---|---|---|
| Selected Word Line | 10 | −10 | 1.5 |
| non-Selected Word Line | 0 | 0 | 0 |
| Bit Line | 5/0 | 2/0 | — |
| Common Source Line | 0 | 0 | 0 |

During verify writing, hot electron injection is performed by setting the word line potential to 10 V, the bit line potential to 5 V, and source line potential to 0 V. The bit line potential of memory cells that share the word line but do not perform writing are set to 0 V. During verify erasing, electron discharge toward a drain side is performed by setting the word line potential to −10 V, the bit line potential to 2 V, and the source line potential to 0 V. The bit line potential of memory cells that share the word line but do not perform the erasing are set to 0 V.

It should be noted here that on-current flow through the memory element during writing, so that the number of memory elements, for which it is possible to perform writing at the same time, is limited by the current driving capability of a circuit for writing information into the memory cells and the like. In this embodiment, it is assumed that it is possible to perform one-line simultaneous writing within a range of the current driving capability. However, in the case where it is difficult to perform the one-line simultaneous writing, for instance, there arises no problem by diving one line and performing simultaneous writing to elements whose number is commensurate with the current driving capability.

On the other hand, the memory elements are placed in OFF states during erasing and a consumed current becomes small even during the one-line simultaneous erasing. Note that in this case, it is required to pay attention to the off-currents of other memory elements connected to a bit line in parallel. The word line potential (10 V) in the selected line takes a negative great value, in comparison with the word line potential (0 V) of each not-selected line, and the memory elements in the selected line have the largest off-currents. However, if the number of parallel elements is increased, there occurs the reduction of reading accuracy due to the off-currents of other memory cells. In such a case, there arises no problem if one row is divided to form blocks composed of elements whose number does not affect reading and there is constructed a circuit in which off-currents flow only within the block. For instance, there may be obtained a circuit construction, in which main source lines and sub-source lines are provided and connected by selection transistors, or a circuit construction, in which main bit lines and sub-bit lines are provided and connected by selection transistors. As an example of such circuit constructions, it is possible to refer to the second embodiment.

Figure 12:
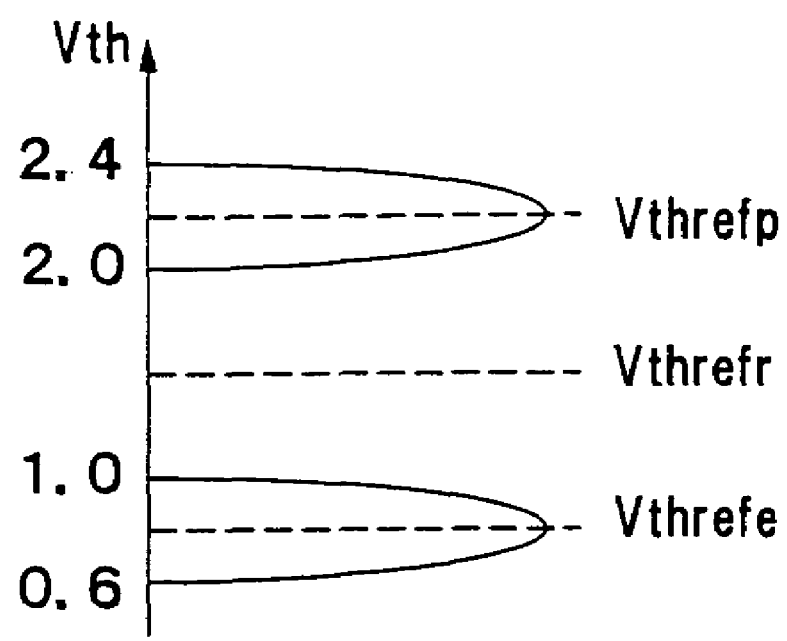
FIG. 12 shows the threshold voltage distribution of the nonvolatile memory of the present invention.

It is assumed that the threshold voltages of the memory elements are distributed as shown in FIG. 12 in the writing and erasing operations described above. That is, it is assumed that the threshold voltage of each memory element into which information has been written exists between 2.0 to 2.4 V and the threshold voltage of each memory element from which information has been erased exists between 0.6 to 1.0 V. Needless to say, these threshold voltages are shown as just a few examples and the present invention is not limited to these values.

As an ordinary reading method, for instance, it is enough that a bit line potential is read in setting a word line to 1.5 V after a bit line is pre-charged to 1 V. In this case, each memory element into which information has been written is placed in an OFF state and a corresponding bit line stays at 1 V. Also, each memory element from which information has been erased is placed in an ON state and a corresponding bit line is discharged to 0 V.

Next, the bit line driving circuit 1004 and the operation circuit 1005 will be described. A bit line voltage VBLp during HE injection, a bit line voltage VBLe during FN discharge, a bit line voltage VBLr that is necessary during reading, a bit line voltage VBL0 in a non-operation state, a reference voltage Vrefp during the HE injection, a reference voltage Vrefe during the FN discharge, a reference voltage Vrefr during reading, and signals S0 and S1 are inputted into the bit line driving circuit 1004. Also, the verify signals Sv (1) to (n), which show whether the verify operation is finished, and bit line potentials are outputted from respective operation circuits (1) to (n). Also, the signal Sva that is a signal obtained by ANDing the n verify signals Sv (1) to (n) is outputted from the operation circuit 1004. A word line voltage VWLp during the HE injection, a word line voltage VWLe during the FN discharge, a word line voltage VWLr during reading, a word line voltage VWL0 in a non-operation state, and the verify signal Sva. The operation circuit 1005 also outputs a word line potential.

Figure 13A:
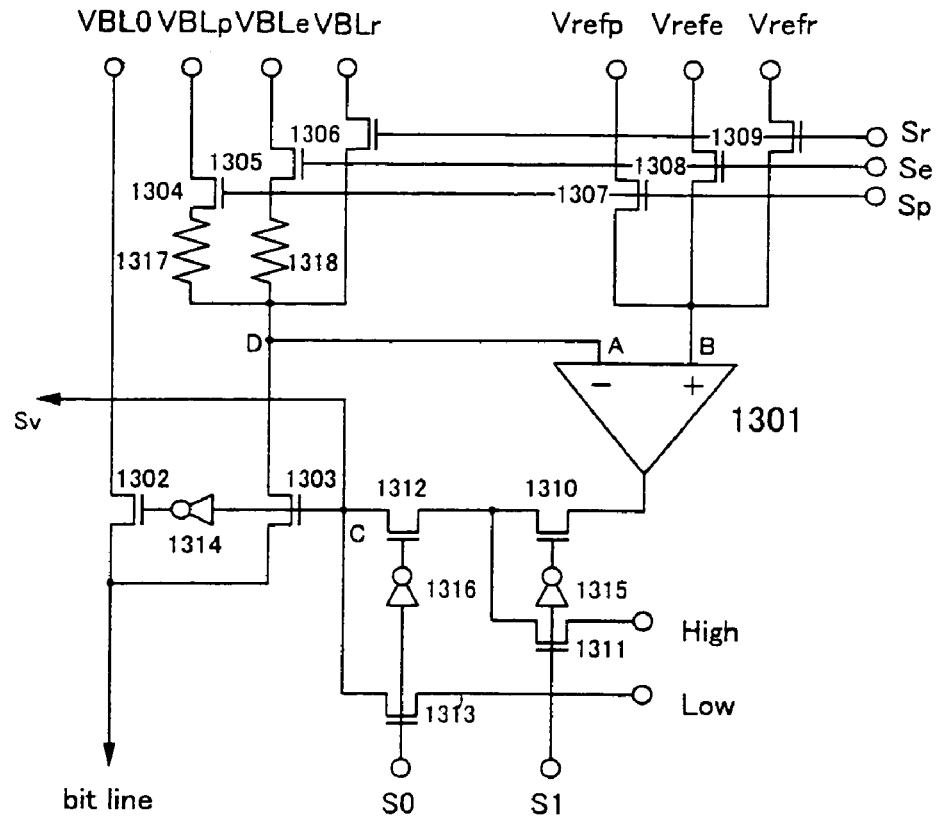
FIGS. 13A and 13B are circuit diagrams illustrating the verify operation of the nonvolatile memory of the present invention.

It suffices that the fundamental constructions of the operation circuits 1004 and 1005 are the same as those of the circuit diagram shown in FIG. 1. For instance, it is possible to use respective circuit diagrams shown in FIGS. 13A and 13B. The circuit shown in FIG. 13A is constructed of a sense amplifier 1301, switch transistors 1302 to 1313, inverters 1314 to 1316, and resistors 1317 and 1318. Signal lines Sp, Se, and Sr are connected to gate electrodes of the switch transistors 1304, 1305, and 1306, respectively. One of the bit line potentials VBLp, VBLe, and VBLr is selected and is connected to a node D. Note that the resistor 1317 is provided between the switch transistor 1304 and the node D and the resistor 1318 is provided between the switch transistor 1305 and the node D. The switch transistors 1302 and 1303 and the inverter 1314 constitute a switch changed by the verify signal Sv. In the case where the verify signal Sv is High, a bit line is connected to the node D. On the other hand, in the case where the verify signal Sv is Low, the bit line is connected to VBL0. In a like manner, the gate electrodes of the switch transistors 1307, 1308, and 1309 are connected to the signal lines Sp, Se, and Sr, respectively. One of the reference potentials Vrefp, Vrefe, and Vrefr is selected and is connected to a node B. The sense amplifier 1301 has as inputs a node A and the node B. Further, the node A is connected to the node D. The verify signal Sv is selected from among the output from the sense amplifier 1301, a Low fixed potential, and a High fixed potential. The switch transistors 1310 and 1311 and the inverter 1315 constitute a switch changed by the signal S1, and select one of the output from the sense amplifier 1301 and the Low fixed potential. The switch transistors 1312 and 1313 and the inverter 1316 constitute a switch changed by the signal S0, and select one of a signal selected by the signal S1 and the High fixed potential. Note that in the case where the potential of the node A is higher than the potential of the node B, the output from the sense amplifier 1301 becomes High. On the other hand, in the case where the potential of the node A is lower than the potential of the node B, the output from the sense amplifier 1301 becomes Low.

The circuit shown in FIG. 13A fundamentally has the same construction as that of the circuit shown in FIG. 1 except that a plurality of bit line potentials and a plurality of reference potentials in operation states are provided and are selected in writing/erasing and reading. It is possible to understand how the circuit operates from the description given with reference to FIG. 1. That is, there is constructed a feedback circuit that is placed in a non-operation state in the case where the signal S0 is High and the signal S1 is Low, is placed in an operation state in the case where the signal S0 is Low and the signal S1 is High, and regards the verify signal Sv as a feedback signal in the case where the signal S0 is Low and the signal S1 is also Low.

Another difference from the circuit shown in FIG. 1 is that a switch transistor 1303 is provided between an input potential (node A) of the sense amplifier 1301 and the bit line. With this construction, the node A does not take VBL0 and assumes any one of the potentials VBLp, VBLe, and VBLr in an non-operation state, therefore it is possible to obtain a reference voltage in an operation state that is the same as a reference voltage in a non-operation state.

It should be noted here that the resistors 1317 and 1318 are not limited to resistive elements and may be circuits that can be effectively regarded as resistors. Also, although the circuit shown in FIG. 1 adopts a scheme with which a drain voltage is read, the present invention is not limited to this. A drain current may be read and another publicly known reading method may be applied.

Figure 13B:
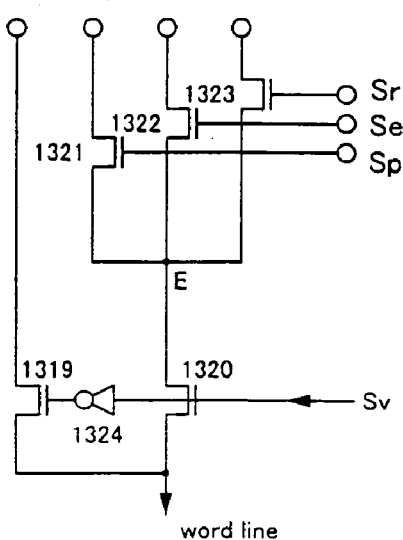

The circuit shown in FIG. 13B is constructed of the switch transistors 1319 to 1323 and the inverter 1324. Signal lines Sp, Se, and Sr are respectively connected to the gate electrodes of the switch transistors 1321, 1322, and 1323, and one of the word line potentials VWLp, VWLe, and VWLr is selected and connected to the node E. The switch transistors 1319 and 1320 and the inverter 1324 constitute a switch changed by the verify signal Sv. Each word line is connected to the node E in the case where the verify signal Sv is High, and is connected to VWL0 in the case where the verify signal Sv is Low.

Next, there will be described verify writing and verify erasing. Their fundamental operations are the same as those described in the above embodiment modes. The timing charts of the verify writing and the verify erasing are shown in FIGS. 14A and 14B.

Figure 14A:
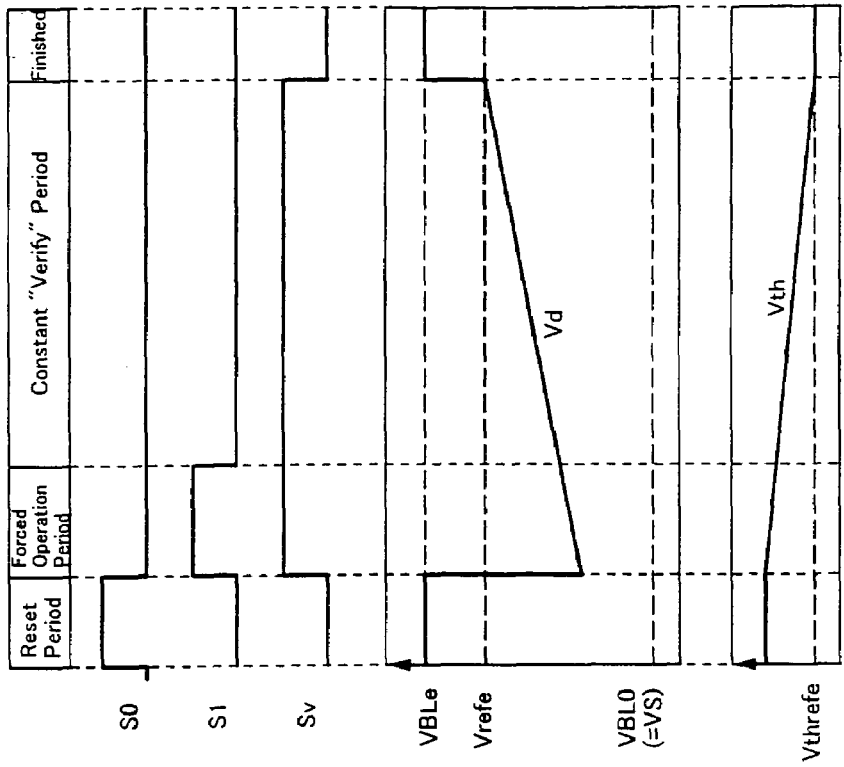
FIGS. 14A and 14B are timing charts illustrating the verify operation of the nonvolatile memory of the present invention.
Figure 14B:
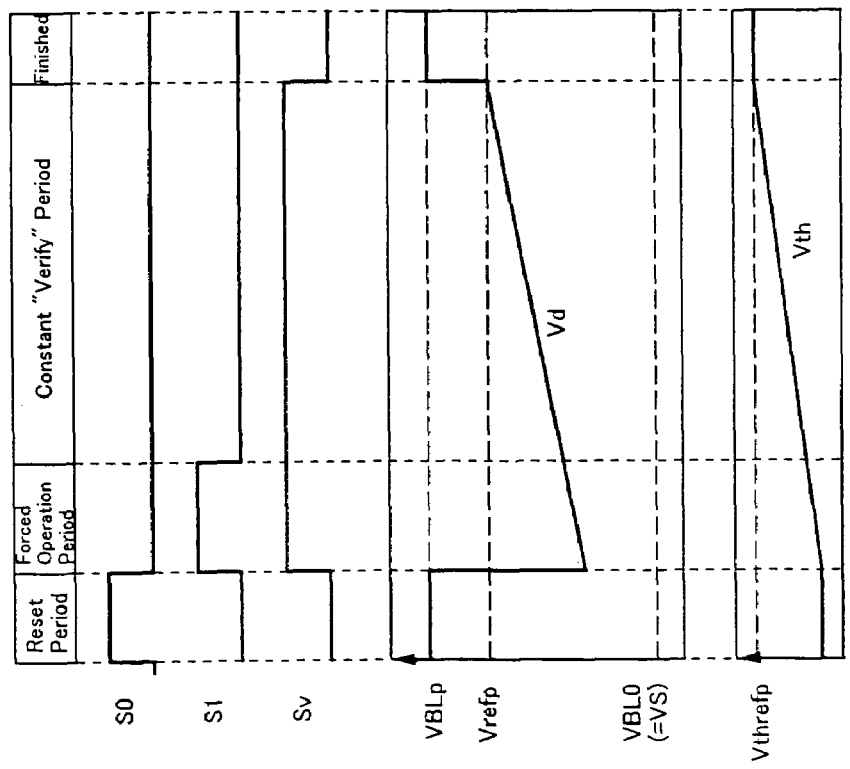

First, FIG. 14A will be referred to FIG. 14A. During the verify writing, the signal Sp becomes High and the signals Se and Sr become Low, and one of VBL0 and VBLp is selected as the potential of the bit line. Also, Vrefp is connected to the input terminal (node B) of the sense amplifier. As in the above embodiment modes, this timing chart is constructed of a reset period (S0 is High, S1 is Low, and the bit line potential is VBL0), a forced operation period (S0 is Low, S1 is High, and the bit line potential is VBLp), and a constant verify period (S0 is Low and S1 is also Low).

In FIG. 14A, it is shown to change a threshold voltage and a drain voltage in the case of taking as an example a memory element in which information is not yet sufficiently written. With referring to the operation voltages shown in Table 1 and the circuit diagram shown in FIG. 13, the potential of each signal may be, for instance, set as VBL0=0 V and VBLp=7 V. The reference threshold voltage Vthrefp is set so that the distribution after writing becomes the distribution shown in FIG. 12. In the case where a reading error is around 0.2 V, for instance, the voltage Vthrefp may be set to 2.2 V in order to set a threshold voltage after writing at least equal to 2.0 V. In an operation state, the reference voltage Vrefp may be set as a voltage (Vrefp=6 V, for instance) at which the threshold voltage of each memory element becomes Vthrefp in the case of VD=Vrefp. In the operation state, the potential VD of the node D is increased because the threshold voltage of the memory element is increased and the on-resistance of the memory element is also increased. Also, in a non-operation state, the switch transistor 1303 is turned off, so that the potential becomes VBLp (7 V). The operation state becomes stable under a condition of VD<Vrefp and the non-operation state becomes stable under a condition of VD>Vrefp, so that it becomes possible to use the same value of the reference voltage Vrefp in both of the operation state and the reference voltage Vrefp in the non-operation state.

It should be noted here that a condition of VD>Vrefp is obtained during a forced operation in the case where the initial state of the memory element is Vth>Vthref, so that the verify signal Sv is reversed and the operation state is shifted to the non-operation state immediately after the forced operation period is finished.

When all verify operations for one line are finished, the verify signal Sva changes from Low to High. The operation circuit shown in FIG. 13B is designed so that the word line potential is switched from VWLp to VWL0 by referring to this signal.

Next, FIG. 14B will be referred to. During verify erasing, the signal Se become High and the signals Sp and Sr become Low. Also, one of VBL0 and VBLe is selected as the potential of the bit line. Also, Vrefe is connected to the input terminal (node B) of the sense amplifier. As in the above embodiment modes, this timing chart is constructed of a reset period (S0 is High, S1 is Low, and the bit line potential is VBL0), a forced operation period (S0 is Low, S1 is High, and the bit line potential is VBLe), and a constant verify period (S0 is Low and S1 is also Low).

In FIG. 14B, it is shown a manner to change a threshold voltage and a drain voltage in taking, as an example, a memory element from which information is not yet sufficiently erased. By referring to the operation voltages shown in Table 1 and the circuit diagram shown in FIG. 13, the potential of each signal may be, for instance, set as VBL0=0 V and VBLe=2 V. The reference threshold voltage Vthrefe is set so that the distribution after erasing becomes the distribution shown in FIG. 12. In the case where a reading error is around 0.2 V, for instance, the voltage Vthrefe may be set to 0.8 V in order to set a threshold voltage after erasing to 1.0 V or below. In an operation state, the reference voltage Vrefe may be set to a voltage (Vrefe=1.5 V, for instance) at which the threshold voltage of each memory element becomes Vthrefe in the case of VD=Vrefe. In the operation state, the potential VD of the node D is increased because the threshold voltage of the memory element is decreased and the on-resistance of the memory element is increased. Also, in a non-operation state, the switch transistor 1303 is turned off, so that the potential becomes VBLe (2V). The operation state is stable under a condition of VD<Vrefe and the non-operation state is stable under a condition of VD>Vrefe, so that it becomes possible to use a common value for both of the reference voltage Vrefe in the operation state and the reference voltage Vrefe in the non-operation state.

It should be noted here that a condition of VD>Vrefe is obtained during a forced operation in the case where the initial state of the memory element is Vth>Vthrefe, so that the verify signal Sv is reversed and the operation state is shifted to the non-operation state immediately after the forced operation period is finished.

When all verify operations for one line are finished, the verify signal Sva changes from Low to High. The operation circuit shown in FIG. 13B is designed so that the word line potential is switched from VWLe to VWL0 by referring to this signal.

It should be noted here that the threshold voltage of the memory element is unnecessarily increased or decreased in the forced operation period that in the case where the initial state of the memory element is Vth>Vthrefe or Vth<Vthrefp. However, it is possible to perform the reading operation in an extremely short time, in comparison with a writing/erasing period. Therefore, it is substantially possible to set the degree of change in the threshold voltage during the forced operation period to a negligible level. It is preferable that the forced operation period is set to 1 µsec or shorter:

In this embodiment, there has been described a case of adopting the one-line simultaneous writing and bit-by-bit verify scheme by the HE injection and the one-line simultaneous erasing and bit-by-bit verify scheme by the FN discharge. However, it is also possible to adopt a batch operation scheme in one of the HE injection and the FN discharge. For instance, it may be possible to use a method of the one-line simultaneous writing and bit-by-bit verify scheme by the HE injection and the batch erasing scheme by the FN discharge, or a method of the batch erasing scheme by the HE injection and the one-line simultaneous writing and bit-by-bit verify scheme by the FN discharge. In this case, it suffices that the batch operation is performed with a method that is the same as a conventional method.

Second Embodiment

There will be described an embodiment in which the constant verify scheme of the present invention is applied to a binary NOR-type nonvolatile memory constructed of p-channel type memory elements. In this embodiment, there will be described a case of adopting the one-line simultaneous writing and bit-by-bit verify scheme by the FN injection and the one-line simultaneous erasing and bit-by-bit verify scheme by the FN discharge.

Figure 15:
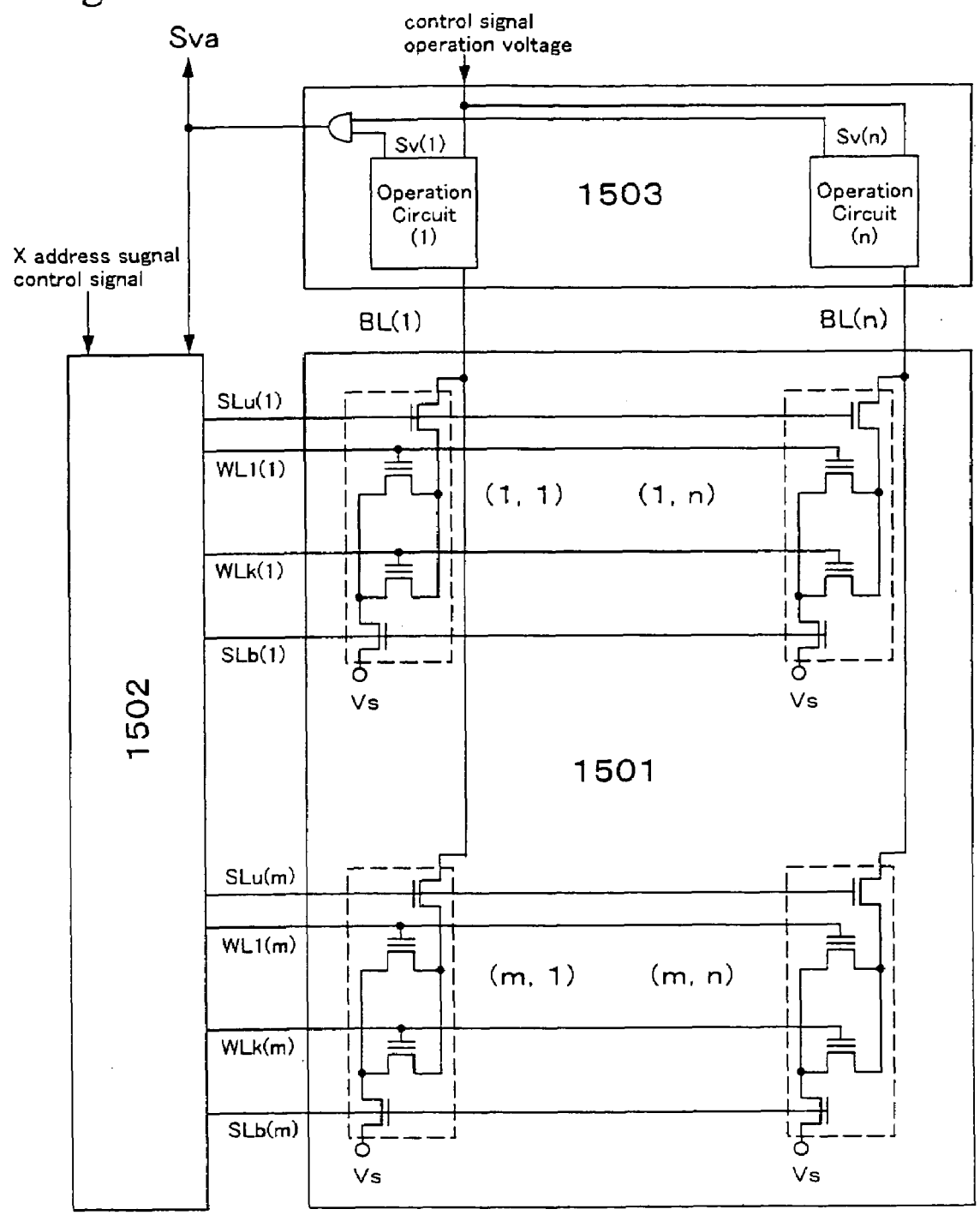
FIG. 15 is a block diagram of the nonvolatile memory of the present invention.

An example of the block circuit diagram of the nonvolatile memory in this embodiment is shown in FIG. 15. The memory cell array shown in FIG. 15 has a circuit construction, in which memory elements connected in parallel to form one row is divided into a plurality of blocks, and is also called the "AND-type nonvolatile memory".

The block circuit diagram shown in FIG. 15 is constructed of a memory cell array 1501 in which memory cells are arranged in an m-line by n-row matrix manner (m and n are each integers equal to or more than one), a word line driving circuit 1502, and a bit line driving circuit 1503 which has operation circuits (1) to (n). In FIG. 15, there are shown memory cells (1, 1), (1, n), (m, 1) and (m, n) at four corners among the m by n memory cells. Each memory cell is constructed of k memory elements connected in parallel (k is an integer equal to or more than one), a drain side selection transistor that connects the drain region of each memory element to a bit line, and a source side selection transistor that connects the source region of each memory element to a common source line. The control gate electrodes of the k memory elements constituting the memory cell (i, j) (i is between one and m inclusive and j is between one and n inclusive) are respectively connected to word lines WL1 (i) to WLk (i). Also, the gate electrodes of the drain side selection transistors are connected to a selection line SLu (i), and the gate electrodes of the source side selection transistors are connected to a selection line SLb (i). Further, one of the source region and the drain region of each drain side selection transistor is connected to a bit line BL (j) and one of the source region and the drain region of each source side selection transistor is connected to a common source line (potential is Vs). The word line driving circuit 1502 is a circuit that gives operation voltages described later to a word line and a selection line, and receives an X address signal, a verify signal Sva, and other control signals. The bit line driving circuit 1503 is a circuit that gives operation voltages described later to bit lines and receives each control signal and operation voltages. The bit line driving circuit 1503 will be described after the description of the operation voltages.

First, examples of the operation voltages during writing/erasing and reading will be summarized in Table 2 given below.

TABLE 2

|  | FN erasing | FN writing | Reading |
|---|---|---|---|
| Selection Line SLu | −5(on) | −5(on) | −5(on) |
| Selected Word Line | 7 | −10 | 1.5 |
| non-Selected Word Line | 0 | 0 | 0 |
| Selection Line SLb | −5(on) | −5(on) | −5(on) |
| Bit Line | −5/0 | 2/0 | — |
| Common Source Line | 0 | 0 | 0 |
| Selection Line (non-selected block) | 0(off) | 0(off) | 0(off) |
| Word Line (non-selected block) | 0 | 0 | 0 |

During verify writing, each selection transistor is placed in an ON state by setting the selection lines Slu and SLb to −5 V and the charge injection by a tunnel current (FN injection) is performed by setting the word line potential to 7 V, the bit line potential to 5 V, and the source line potential to 0 V. The bit line potentials of memory cells that share the word line but do not perform writing are set to 0 V. Note that as to not-selected lines, all selection transistors are placed in an OFF state by setting the selection line to 0 V, and each word line is set to 0 V.

The memory elements have the p-channel type, are placed in OFF states during writing, and the consumed current is small even during the one-line simultaneous writing. In this case, it is also required to pay attention to the off-currents of other memory elements connected in parallel to a bit line. However, in the circuit shown in FIG. 15, there is obtained a construction where one row is divided to form memory cells in which the number of elements does not affect the reading (the number of the elements is referred to as "k" that is an integer equal to or more than one, representative values of k is four, eight, 16, and the like), and off-currents flow only within the block. As a result, the reduction of reading accuracy does not cause any problem.

During the verify erasing, each selection transistor is placed in the ON state by setting the selection lines SLu and SLb to −5 V, and charge discharging to the drain side is performed by setting the word line potential to −10 V, the bit line potential to 2 V, and the source line potential to 0 V. The bit line potentials of memory cells that share the word line but do not perform erasing are set to 0 V. Note that as to the not-selected lines, all selection transistors are placed in the OFF state by setting the selection lines to 0 V and the word lines are also set to 0 V.

The memory elements have the p-channel type, the memory elements are placed in the ON state during erasing, and the consumed current becomes larger than that during writing. In this embodiment, it is assumed that it is possible to perform the one-line simultaneous erasing within the range of the current driving capability of the circuit for erasing a signal from each memory cell. However, in the case where it is difficult to perform the one-line simultaneous erasing, there arises no problem, for instance, if one line is divided to perform block-by-block simultaneous erasing that is commensurate with the current driving capability.

With the writing and erasing operations described above, the threshold voltages of the memory elements are distributed as shown in FIG. 12. That is, it is assumed that the threshold voltages of the memory elements, into which information has been written, exist in a range of 2.0 V to 2.4 V and the threshold voltages of memory elements, from which information has been erased, exist in a range of from 0.6 V to 1.0 V. Needless to say, these threshold voltages are just a few examples and the present invention is not limited to these values.

As an ordinary reading method, for instance, it is possible that the bit line potential is read by setting the word line to 1.5 V after the selection transistor is placed in the ON state by setting the selection lines SLu and SLb to −5 V and the bit line is pre-charged to 1 V. In this case, each memory element, into which information has been written, is placed in an OFF state and a corresponding bit line stays at 1 V. Also, each memory element, from which information has been erased, is placed in an ON state and a corresponding bit line is discharged to 0 V. Note that as to each non-selected line, all selection transistors are placed in OFF states by setting the selection lines to 0 V and the word lines are also set to 0 V.

Figure 16:
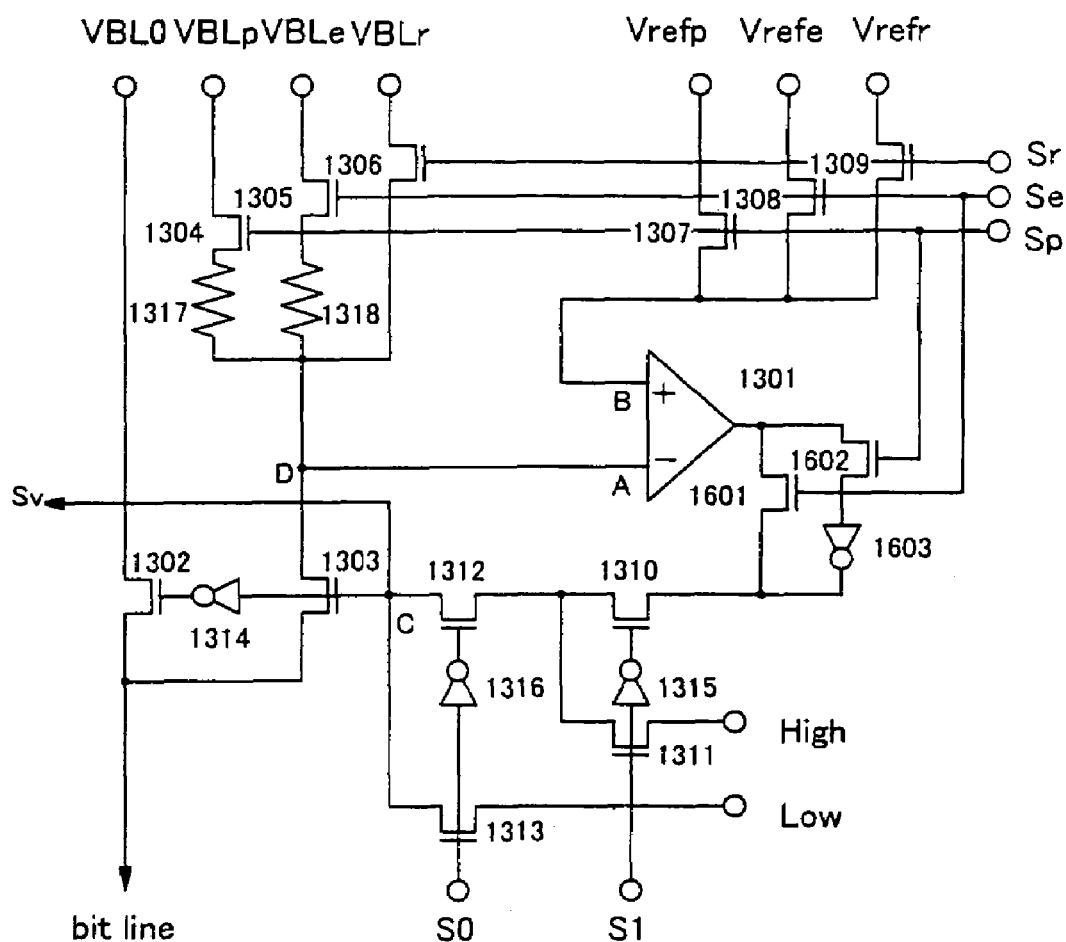
FIG. 16 is a circuit diagram illustrating the verify operation of the nonvolatile memory of the present invention.

Next, the bit line driving circuit 1503 and a constant verify operation will be described. For instance, it is possible to use the circuit shown in FIG. 16 as the n operation circuits (1) to (n) constituting the bit line driving circuit 1503. The circuit diagram shown in FIG. 16 is almost the same as the circuit diagram shown in FIG. 13A and the same reference numbers are assigned to corresponding places. The circuit diagram shown in FIG. 16 differs from that shown in FIG. 13A in the output from the sense amplifier 1301, and switch transistors 1601 and 1602 and an inverter 1603 are newly provided. The circuit diagram shown in FIG. 16 becomes a circuit that is an equivalent to the circuit shown in FIG. 13A during verify erasing, and becomes a circuit, in which the output from the sense amplifier is reversed, during verify writing. As in FIG. 13A, there is constructed a feedback circuit that is placed in a non-operation state in the case where the signal S0 is High and the signal S1 is Low, is placed in an operation state in the case where the signal S0 is Low and the signal S1 is High, and regards the verify signal Sv as a feedback signal in the case where the signal S0 is Low and the signal S1 is also Low.

Figure 17:
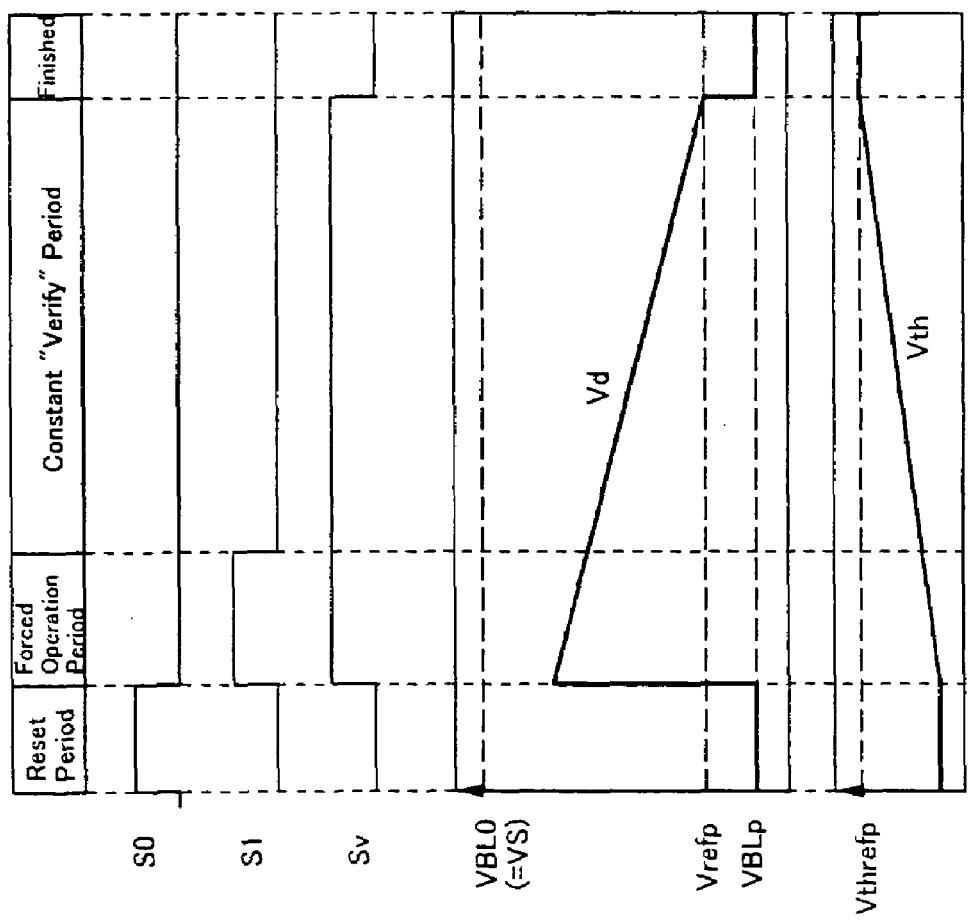
FIG. 17 is a timing chart illustrating the verify operation of the nonvolatile memory of the present invention.

The verify writing is performed by the FN injection scheme and an example of a timing chart is shown in FIG. 17. On the other hand, the verify erasing is the same as that described in the first embodiment and is expressed by the timing chart shown in FIG. 14B. In either case, the timing chart is constructed of a reset period (S0 is High, S1 is Low, and the bit line potential is VBL0), a forced operation period (S0 is Low, S1 is High, and the bit line potential is VBLp/VBLe), and a constant verify period (S0 is Low and S1 is also Low).

During a verify writing operation, VBL0 and VBLp may be, for instance, set to 0 V and 7 V, respectively by referring to the operation voltages shown in Table 2 and the circuit diagram shown in FIG. 16. The reference threshold voltage Vthrefp is set so that the distribution after writing becomes the distribution shown in FIG. 12. In the case where a reading error is around 0.2 V, for instance, the voltage Vthrefp may be set to 2.2 V in order to obtain a threshold voltage after writing at least equal to 2.0 V or higher. In an operation state, the reference voltage Vrefp may be set to a voltage (Vrefp=5 V, for instance) at which the threshold voltage of each memory element becomes Vthrefp in the case of VD=Vrefp. In the operation state, the potential VD of the node D is decreased because the threshold voltage of the memory element is increased and the effective resistance value of the memory element is increased. Also, the switch transistor 1303 is turned off in a non-operation state, and the potential becomes VBLp (7 V). The operation state becomes stable under a condition of VD>Vrefp and the non-operation state becomes stable under a condition of VD<Vrefp, so that it becomes possible to use a common value for both of the reference voltage in the operation state and the reference voltage in the non-operation state.

It should be noted here that a state of VD<Vrefp is obtained during a forced operation in the case where the initial state of the memory element is Vth>Vthref, so that the verify signal Sv is reversed and the operation state is shifted to a non-operation state immediately after the forced operation period is finished.

During a verify erasing operation, the potential of each signal may be, for instance, set as VBL0=0 V and VBLe=2 V by referring to the operation voltages shown in Table 2 and the circuit diagram shown in FIG. 16. The reference threshold voltage is set so that the distribution after erasing becomes the distribution shown in FIG. 12. In the case where a reading error is around 0.2 V, for instance, the voltage Vthrefe may be set to 0.8 V to set a threshold voltage after erasing to 1.0 V or lower. In an operation state, the reference voltage Vrefe may be set to a voltage (Vrefe=1.5 V, for instance) at which the threshold voltage of each memory element becomes Vthrefe in the case of VD=Vrefe. In the operation state, the potential VD of the node D is increased because the threshold voltage of the memory element is decreased and the effective resistance value of the memory element is increased. Further, in a non-operation state, the switch transistor 1303 is turned off, so that the potential becomes VBLe (2 V). The operation state becomes stable under a condition of VD<Vrefe and the non-operation state becomes stable under a condition of VD>Vrefe, so that it becomes possible to use a common value for both of the reference voltage in the operation state and the reference voltage in the non-operation state.

It should be noted here that a state of VD>Vrefe is obtained in a forced operation in the case where the initial state of the memory element is Vth>Vthrefe, so that the verify signal Sv is reversed and the operation state is shifted to a non-operation state immediately after the forced operation period is finished.

It should be noted here that the threshold voltage of the memory element is unnecessarily increased or decreased in the forced operation period that in the case where the initial state of the memory element is Vth>Vthrefe or Vth<Vthrefp. However, it is possible to perform the reading operation in an extremely short time, in comparison with a writing/erasing period. Therefore, it is substantially possible to set the degree of change in the threshold voltage during the forced operation period to a negligible level. It is preferable that the forced operation period is set to 1 μsec or shorter.

In this embodiment, there has been described a case of adopting the one-line simultaneous writing and bit-by-bit verify scheme by the FN injection and the one-line simultaneous erasing and bit-by-bit verify scheme by the FN discharge. However, it is also possible to adopt a batch operation scheme in one of the FN injection and the FN discharge. For instance, it may be possible to use a method of the one-line simultaneous writing and bit-by-bit verify scheme by the FN injection and the batch erasing scheme by the FN discharge, or a method of the batch erasing scheme by the FN injection and the one-line simultaneous writing and bit-by-bit verify scheme by the FN discharge. In this case, it suffices that the batch operation is performed with a method that is the same as a conventional method.

Third Embodiment

In this embodiment, there will be described a case where the constant verify scheme of the present invention is applied to a NAND-type nonvolatile memory. The NAND-type nonvolatile memory is characterized by that memory elements are connected in series. In more detail, it is possible to express the NAND-type nonvolatile memory by changing the k memory elements connected in parallel in FIG. 15 into k memory elements connected in series.

In the NAND-type nonvolatile memory, if all of transistors, that are connected to memory elements for performing operations in series, are placed in the ON state, and these transistors are regarded as selection transistors, it is possible to apply the constant verify scheme of the present invention with an idea that is similar to that used for the NOR type.

Since the NAND-type nonvolatile memory has a construction where the memory elements are connected in series, there is a problem that it is difficult to precisely know the state of each selected element in the case where the constant verify scheme is applied. In the following description, there will be explained a case of adopting the one-line simultaneous operation and bit-by-bit verify scheme by the FN injection and the one-line simultaneous operation and bit-by-bit verify scheme by the FN discharge by assuming n-channel type memory elements.

In the case of performing the one-line simultaneous operation and bit-by-bit verify scheme by the FN injection, the source side selection transistor and the drain side selection transistor of each selected memory cell is placed in the ON state, the word line for which an operation is performed is set to 10 V, and the other word lines are set to 5 V. Then, source lines are set to GND and the bit line is set to −5 V to perform the FN injection. As to each row in which no operation is performed, the bit lines are set to 0 V. During the operation, in principle, it becomes possible to read the threshold voltage of each memory element by judging a drain current or a drain voltage using an operation circuit that is similar to those in the embodiment modes and the first and second embodiments. In this case, however, the effective resistance value of each memory cell, to which writing is performed, is small in comparison with other memory elements connected in series, so that it is difficult to perform precise reading. Also, since each memory element, to which an operation is performed, is placed in an ON state, the consumed current becomes large.

In the case of performing the one-line simultaneous operation and bit-by-bit verify scheme by the FN discharge, the source side selection transistor and the drain side selection transistor are placed in an ON state in each selected memory cell, the word line for which an operation is performed is set to −10 V, and the other word lines are set to 5 V. Then, source lines are set to GND and the bit line is set to 5 V to perform the FN discharge. As to each row in which no operation is performed, the bit lines are set to 0 V. During an operation, by judging a drain current or a drain voltage using an operation circuit that is similar to those in the embodiment modes and the first and second embodiments, it becomes possible to read the threshold voltage of each memory element. In this case, since each memory element that performs an operation is placed in an OFF state and the effective resistance value thereof is large in comparison with other memory elements connected in series, there arises no problem concerning reading accuracy. Also, the consumed current becomes small.

As described above, in the NAND-type nonvolatile memory, it is preferable to adopt the one-line simultaneous operation and bit-by-bit verify scheme by the FN discharge as a writing operation. It is enough that the batch erasing by the FN injection is adopted to perform erasing.

Fourth Embodiment

With the constant verify scheme of the present invention, it is possible to realize a threshold voltage distribution with a very narrow distribution width and a high-speed operation. The feature like this is particularly effective in a multilevel nonvolatile memory whose distribution margin of a threshold voltage is small.

Figure 18:
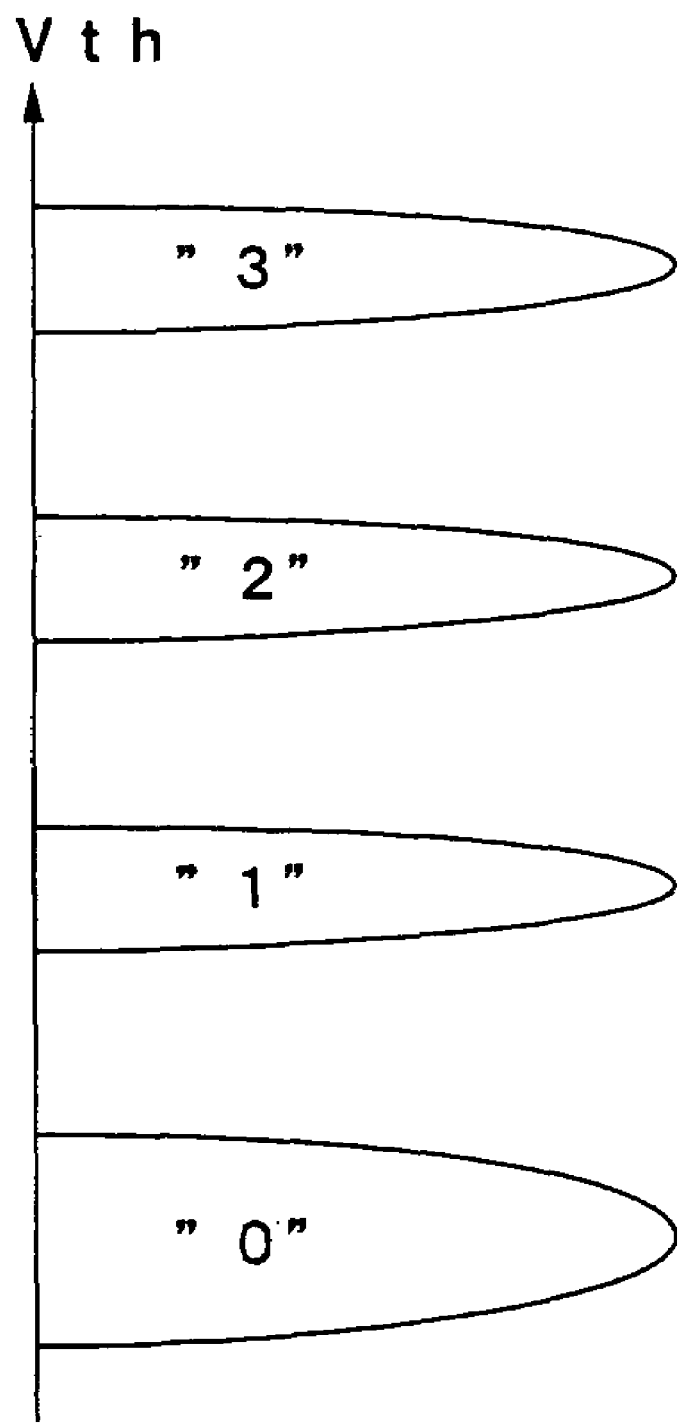
FIG. 18 shows the threshold voltage distribution of the nonvolatile memory of the present invention.

The multilevel nonvolatile memory is constructed of memory elements that each store at least three states. In this embodiment, there is conceived a four-valued nonvolatile memory in which the states of memory elements are classified into four states of "0", "1", "2", and "3" by classifying the threshold voltages of the memory elements into four states. In FIG. 18, there is shown the distribution of a threshold voltage expressing the four states.

In this embodiment, there will be described a four-valued nonvolatile memory that performs the constant verify writing and batch erasing. It is enough that a publicly known circuit construction and operation method are used for the batch erasing and the reading method and, therefore, the description concerning the batch erasing and the reading method are omitted. Needless to say, the constant verify scheme may be adopted for the erasing method. Also, in general, it is possible to apply the constant verify scheme to a k-valued nonvolatile memory (k is an integer equal to or more than two) with a similar idea.

Figure 19:
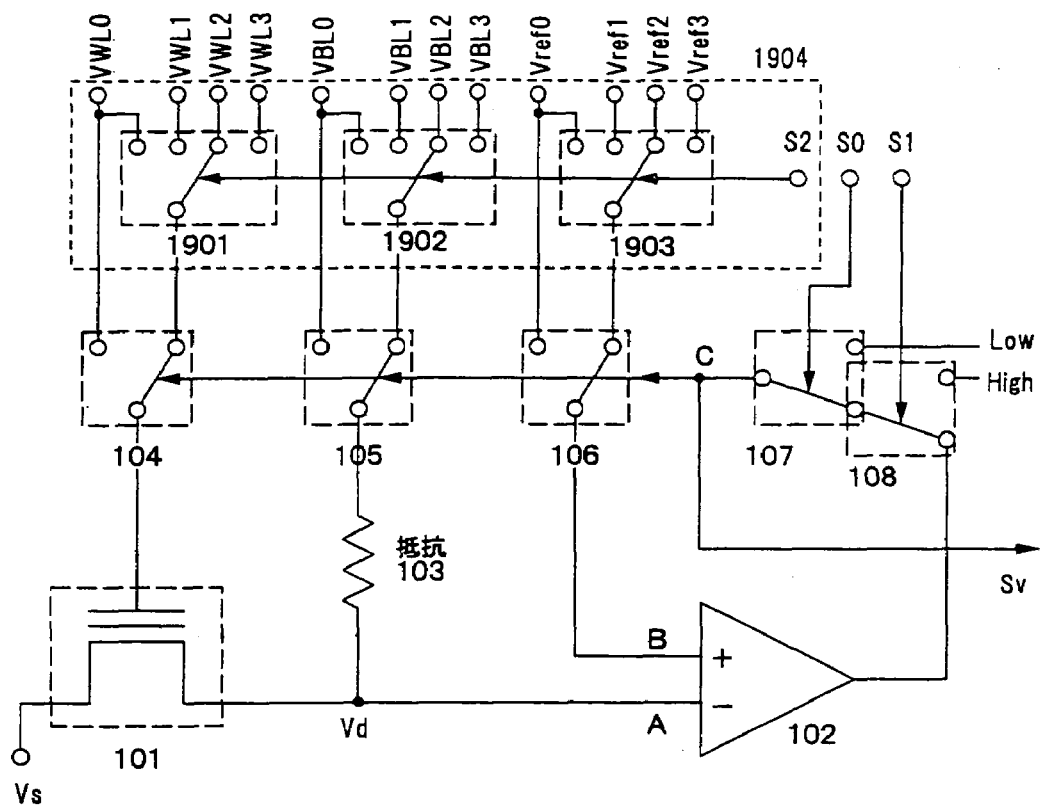
FIG. 19 is a circuit diagram illustrating the verify operation of the nonvolatile memory of the present invention.

The circuit diagram shown in FIG. 19 is an example of a circuit for a four-valued constant verify writing. In the case of performing four-valued writing, it is generally enough that writing operation voltages and reference voltages, which are corresponding to respective states "0", "1", "2", and "3" after writing, are prepared. In the following description, the bit line potential and the word line potential are set to (VBL0, VWL0) during a non-operation state and a writing operation into the "0" state, the bit line potential and the word line potential are set to (VBL1, VWL1) during a writing operation into the "1" state, the bit line potential and the word line potential are set to (VBL2, VWL2) during a writing operation into the "2" state, and the bit line potential and the word line potential are set to (VBL3, VWL3) during a writing operation into the "3" state. Also, the reference voltages during the writing operations into the "0", "1", "2", and "3" states are referred to as Vref0, Vref1, Vref2, and Vref3, respectively.

It should be noted here that it is preferable that the writing operation voltage into a high state, is set as a somewhat high voltage. Also, it is enough to set the reference voltages by taking reading errors into account in order that the corresponding reference threshold voltages fall within the distributions shown in FIG. 18.

Figure 5:
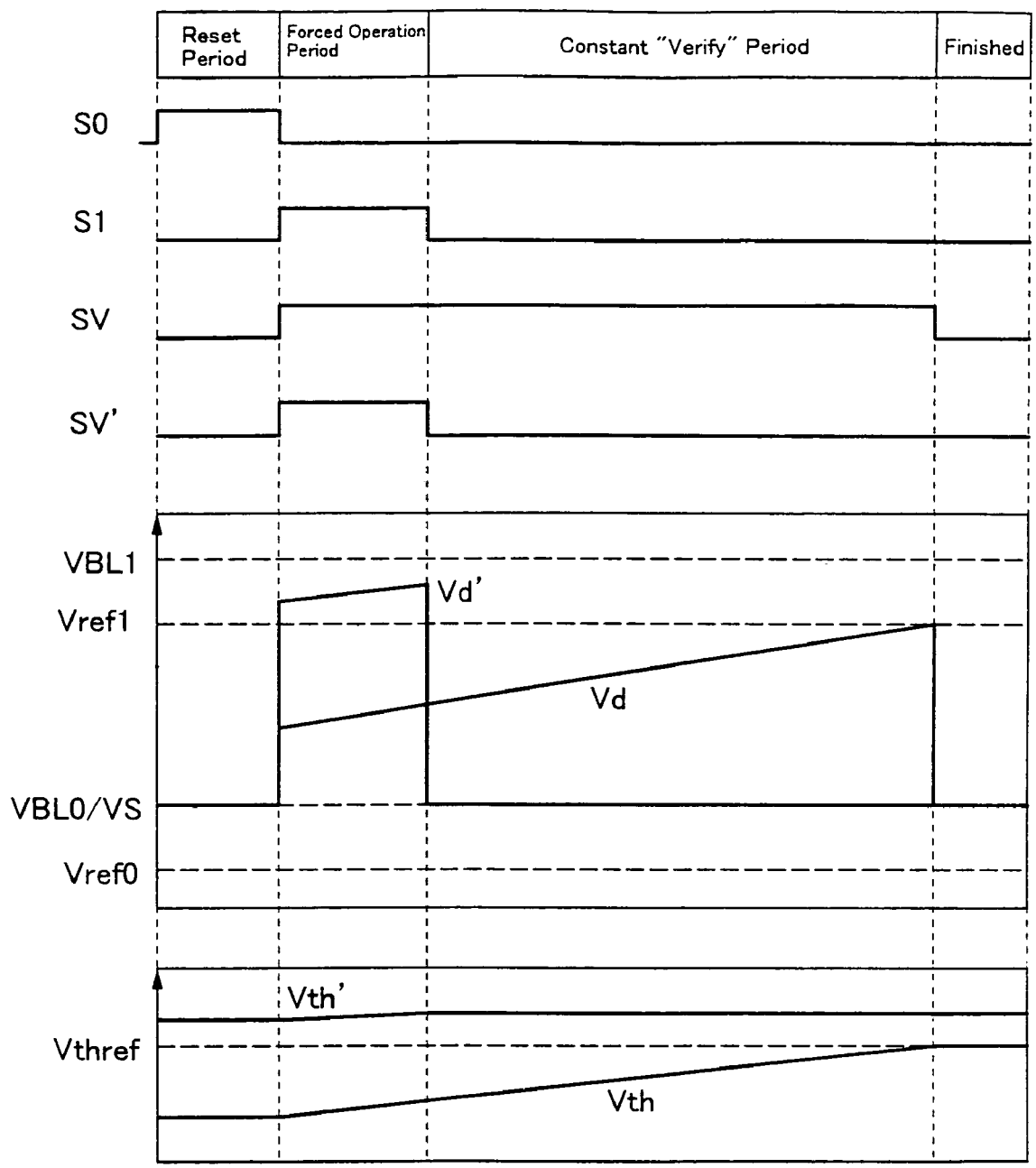
FIG. 5 is a timing chart illustrating the verify operation of the nonvolatile memory of the present invention.

Since he circuit diagram shown in FIG. 19 has the same construction as that of the circuit diagram shown in FIG. 1 except for a region 1904 surrounded by a dotted line, the following description centers on the region 1904 surrounded by the dotted line. Note that the same reference numbers as in FIG. 1 are assigned to corresponding places. The region 1904 surrounded by the dotted line is a circuit that selects a voltage and reference voltage in an operation state on the basis of a signal S2 specifying a writing destination. This circuit is constructed of switches 1901, 1902, and 1903 that each select one of four signals. The switch 1901 selects one of VWL0, VWL1, VWL2, and VWL3 in accordance with the signal S2, the switch 1902 selects one of VBL0, VBL1, VBL2, and VBL3 in accordance with the signal S2, and the switch 1903 selects one of Vref0, Vref1, Vrep2, and Vref 3 in accordance with the signal S2. The circuit construction, in a state where one signal has been selected in accordance with the signal S2, coincides with the circuit diagram shown in FIG. 1 and the timing chart concerning verify writing is expressed by the timing chart shown in FIG. 5.

It should be noted here that, by using a common word line potential in the writing operations into the "0", "1", "2", and "3" states and in a non-operation state, that is, by setting the potentials as VWL0=VWL1=VWL2=VWL3, it becomes possible to perform the one-line simultaneous writing and bit-by-bit verify. Also, in order to simplify the circuit, it is possible to use a common bit line potential in the writing operation into the "0", "1", "2", and "3" states and in the non-operation state, that is, to set the bit line potentials as VBL0=VBL1=VBL2=VBL3.

It should be noted here that it is possible to carry out this embodiment by combining the construction of the this embodiment with the first to third embodiments.

Fifth Embodiment

In this embodiment, there will be shown an example of a sense amplifier circuit used in the constant verify scheme of the present invention.

Figure 20A:
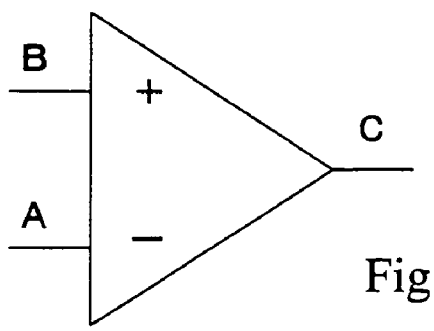
FIGS. 20A to 20C are circuit diagrams of a sense amplifier used for the nonvolatile memory of the present invention.

FIG. 20A shows a circuit symbol of the sense amplifier. In the case where the potential inputted into the node A is higher than the potential inputted into the node B, the output potential of the node C becomes High. On the other hand, in the case where the potential inputted into the node A is lower than the potential inputted into the node B, the output potential of the node C becomes Low. An example of the circuit diagram of the sense amplifier is shown in FIG. 20B.

Figure 20B:
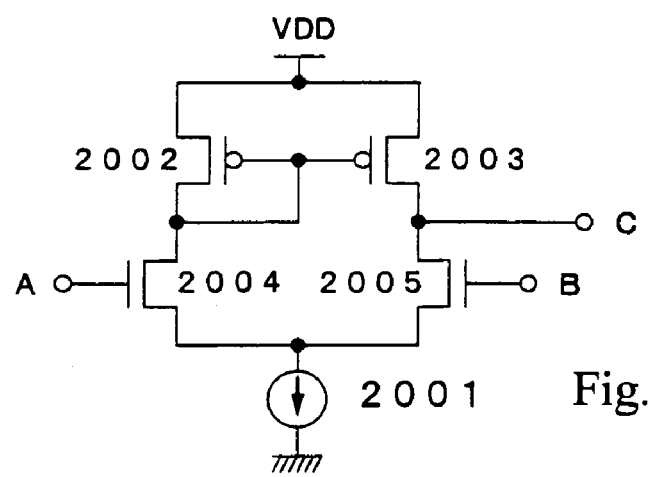
Figure 20C:
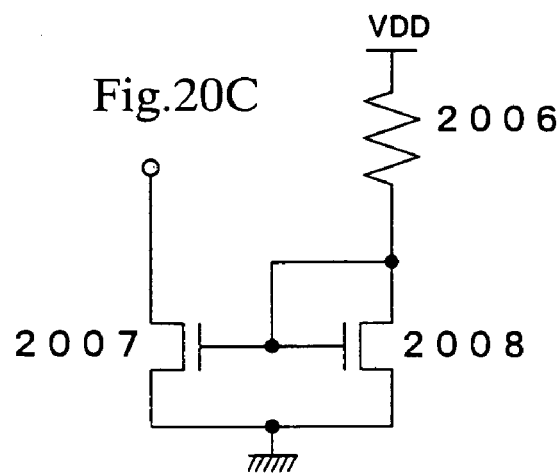

In FIG. 20B, the sense amplifier is constructed of two p-channel type transistors 2002 and 2003, two n-channel type transistors 2004 and 2005, and a constant-current source 2001. As the constant-current source 2001, for instance, it is possible to use the circuit shown in FIG. 20C. In FIG. 20C, there is shown a current mirror type constant-current source including a load resistance 2006 and two n-channel type transistors 2007 and 2008. Needless to say, as the sense amplifier and the constant-current source, there may be used other publicly known circuits.

It should be noted here that it is possible to carry out this embodiment by combining the construction of this embodiment with the first to fourth embodiments.

Sixth Embodiment

As a reading method in the constant verify scheme of the present invention, it is possible to compare currents flowing through bit lines.

Figure 21A:
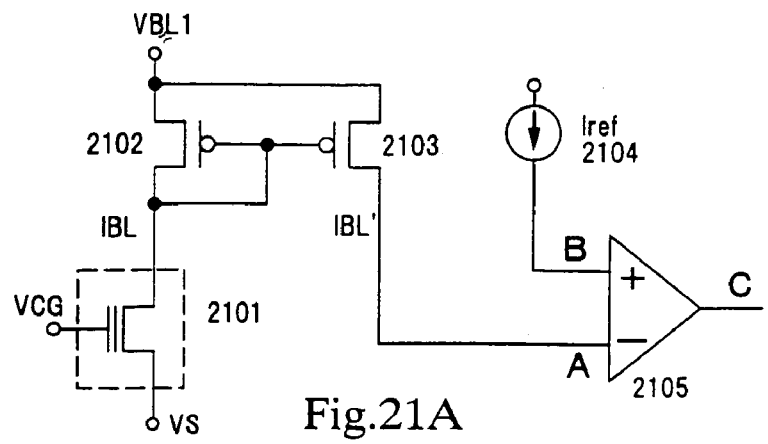
FIGS. 21A to 21C are circuit diagrams of a reading circuit and a sense amplifier of the nonvolatile memory of the present invention.

In FIG. 21A, there is shown an example of the circuit construction of a portion that performs reading in a constant verify operation. The circuit shown in FIG. 21A is constructed of a current mirror circuit including a memory element 2101, two p-channel type transistors 2102 and 2103, a current comparing type sense amplifier 2105, and a constant-current source 2104 for supplying a reference current Iref. In FIG. 21A, a bit line current IBL is copied by the current mirror circuit and a copied bit line current IBL' flows to the node A. On the other hand, the reference current Iref flows to the node B. The current comparing type sense amplifier 2105 compares the copied bit line current IBL' and the reference current Iref. The bit line current IBL varies in accordance with the effective resistance value of the memory element, which makes it possible to read the state of the memory element.

Figure 21B:
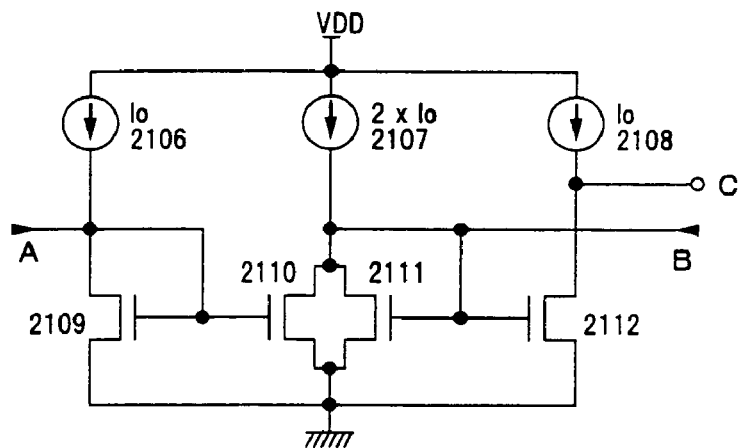

In FIG. 21B, there is shown an example of a circuit diagram of the current comparing type sense amplifier. In FIG. 21B, the current comparing type sense amplifier is constructed of three constant-current sources 2106, 2107, and 2108 and two current mirror circuits. The two current mirror circuits are respectively constructed of two n-channel type transistors 2109 and 2110 and two n-channel type transistors 2111 and 2112. Also, the circuit is designed in order that the current 2xIo that the constant-current source 2107 supplies becomes the sum of the current Io that the constant-current source 2106 supplies and the current Io that the constant-current source 2108 supplies. As to the current comparing, type sense amplifier, the potential of the node C becomes High in the case where the current flowing to the node A is larger than the current flowing to the node B, and the potential of the node C becomes Low in the case where the current flowing to the node A is smaller than the current flowing to the node B.

Figure 21C:
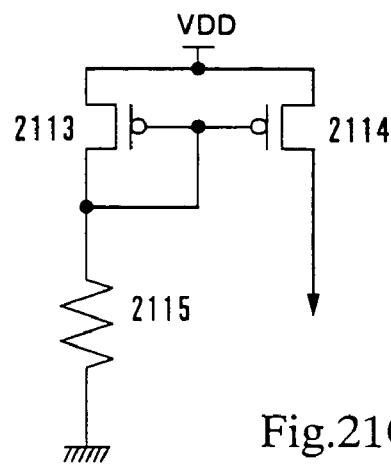

In FIG. 21C, there is shown an example of a circuit diagram of the constant-current source used for the current comparing type sense amplifier. In FIG. 21C, there are shown a current mirror type constant-current source including a load resistance 2115 and two p-channel type transistors 2113 and 2114. Needless to say, it is possible to use other publicly known circuits as the constant-current type sense amplifier and the constant-current sources.

It should be noted here that it is possible to carry out this embodiment by combining the construction of this embodiment with any of the first to fourth embodiments.

Seventh Embodiment

In this embodiment, there will be described an example of a case where the nonvolatile memory of the present invention is applied to a microprocessor like a RISC processor or an ASIC processor packaged on one chip.

Figure 22:
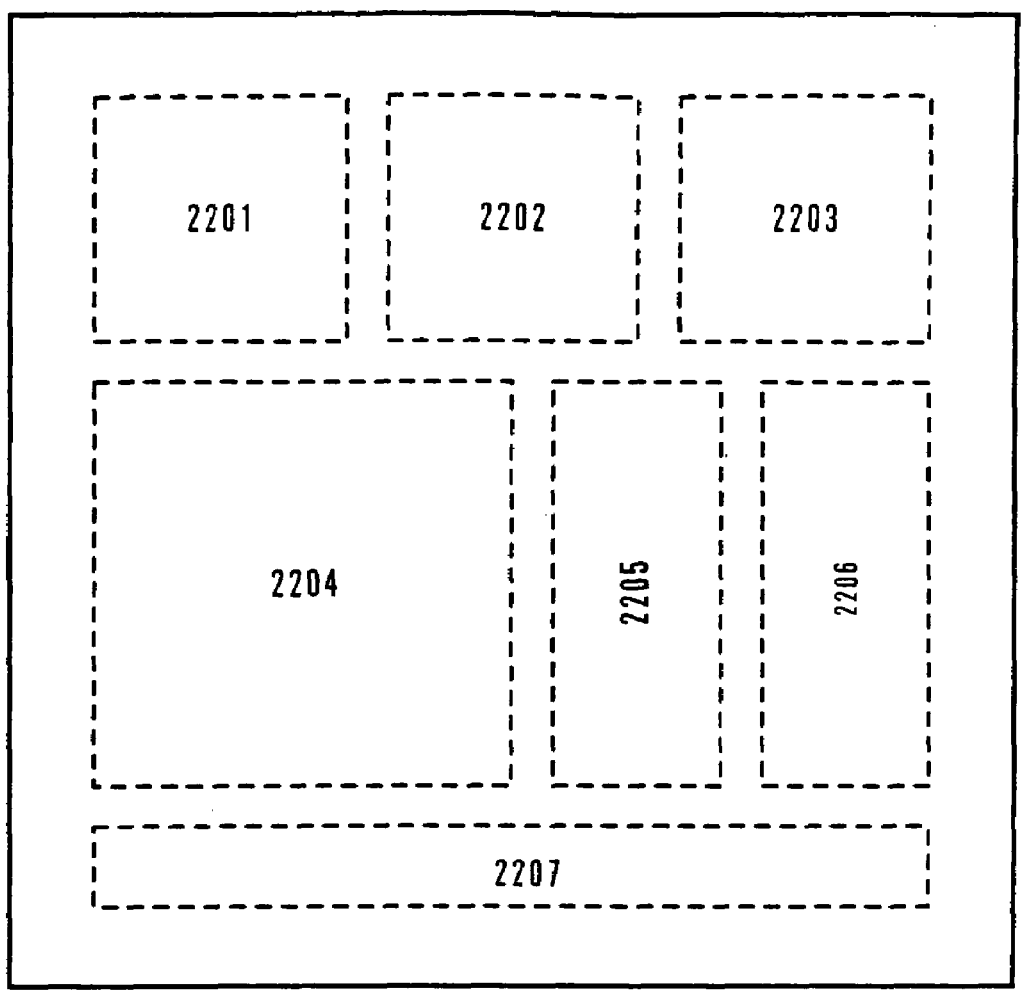
FIG. 22 shows a semiconductor circuit using the nonvolatile memory of the present invention.

FIG. 22 shows an example of the microprocessor. In a typical case, the microprocessor is constructed of a CPU core 2201, a flash memory 2204 (may be replaced with a RAM), a clock controller 2203, a cache memory 2202, a cache controller 2205, a serial interface 2206, an I/O port 2207, and the like. Needless to say, the microprocessor shown in FIG. 22 is a simplified example and the actual circuit design of the microprocessor varies depending on its application purpose.

In the microprocessor shown in FIG. 22, the nonvolatile memory of the present invention is used for the flash memory 2204. Also, it is possible to use the nonvolatile memory of the present invention for the cache memory 2202. Note that it is possible to combine the flash memory 2204 or the cache memory 2202 with the construction of any of the embodiment modes and the first to sixth embodiments.

Eighth Embodiment

It is possible to form the nonvolatile memory of the present invention on a substrate having an insulating surface. In this case, by integrally forming the nonvolatile memory with parts of a semiconductor device constructed of TFTs, it becomes possible provide a multifunctional, high-performance, and small-sized semiconductor device. In this embodiment, as an example of such a semiconductor device, there is shown an electrooptical device (typically, a liquid crystal display device or a light-emitting device) having the nonvolatile memory of the present invention, a pixel portion, a driving circuit for the pixel portion, and a $\bar{a}$ (gamma) correction circuit.

The $\bar{a}$ correction circuit means a circuit for performing $\bar{a}$ correction. The $\bar{a}$ correction means a correction for forming a linear relation between a voltage applied to a pixel electrode and the transmitted light intensity of a light-emitting layer or a liquid crystal above the pixel electrode by adding an appropriate voltage to an image signal.

Figure 23:
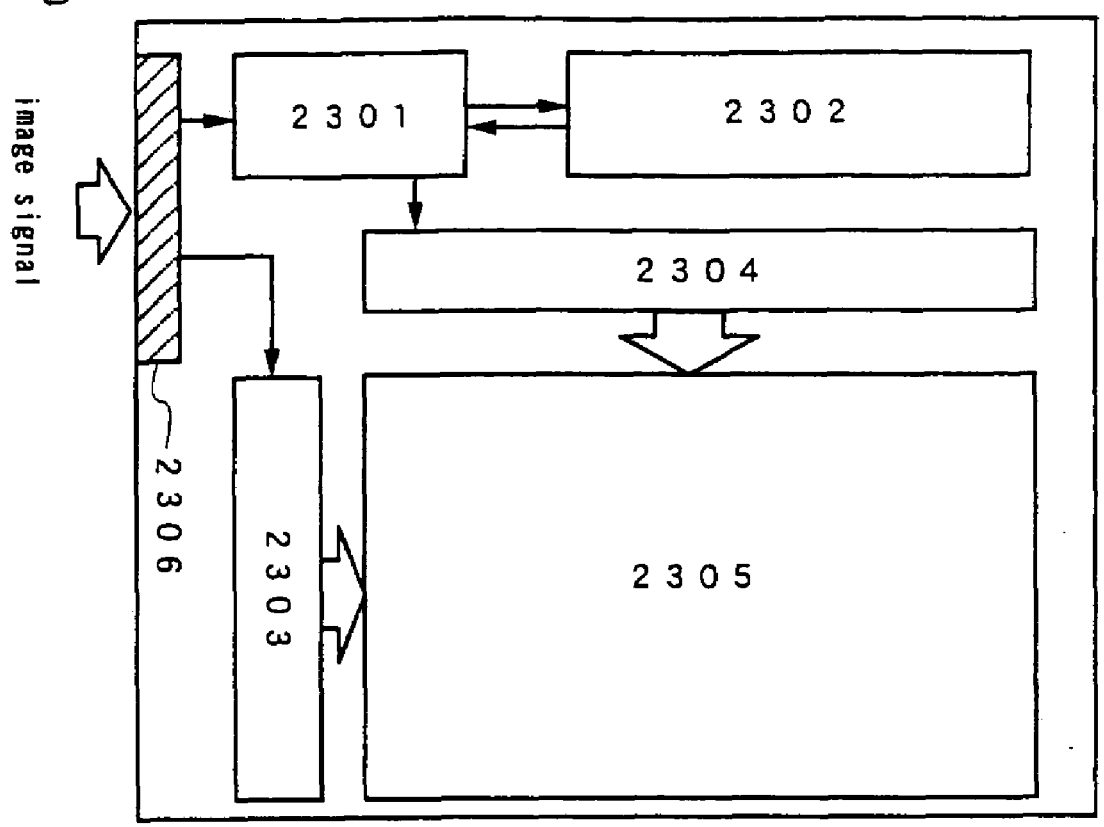
FIG. 23 shows an electrooptical device using the nonvolatile memory of the present invention.

FIG. 23 is a block diagram of the electrooptical device described above. In this drawing, the electrooptical device includes a nonvolatile memory 2302 of the present invention, a pixel portion 2305, a gate signal side driving circuit 2303 and a source signal side driving circuit 2304 that are circuits for driving the pixel portion, and a $\bar{a}$ (gamma) correction circuit 2301. Also, an image signal, a clock signal, a synchronization signal, or the like is sent via a FPC (flexible printed circuit) 2306. There arises no problem even if publicly known circuit constructions are used for the pixel portion 2305, the circuits 2303 and 2304 for driving the pixel portion, and the $\bar{a}$ (gamma) correction circuit 2301.

In the electrooptical device of this embodiment, the nonvolatile memory 2302 stores correction data for performing $\bar{a}$ correction on an image signal sent from the main body of a personal computer, a television receiving antenna, or the like. The $\bar{a}$ correction circuit 2301 performs $\bar{a}$ correction on the image signal by referring to the correction data.

Although the data for performing the $\bar{a}$ correction may be prestored prior to the shipment of the electrooptical device, it is also possible to periodically rewrite the correction data.

Also, even if electrooptical devices are produced in the same manner, there occurs a case where the optical response characteristics (such as the relation between the aforementioned transmitted light intensity and applied voltage) of liquid crystals slightly differ from each other. Even in this case, it is possible to store different $\bar{a}$ correction data for respective electrooptical devices in this embodiment, which makes it possible to obtain the same image quality at all times.

It should be noted here that it is possible to carry out this embodiment by freely combining with the construction of any of the first to sixth embodiments.

Ninth Embodiment

A semiconductor device having the nonvolatile memory of the present invention that is an example differing from the semiconductor device shown in the eighth embodiment will be described with reference to FIG. 24.

Figure 24:
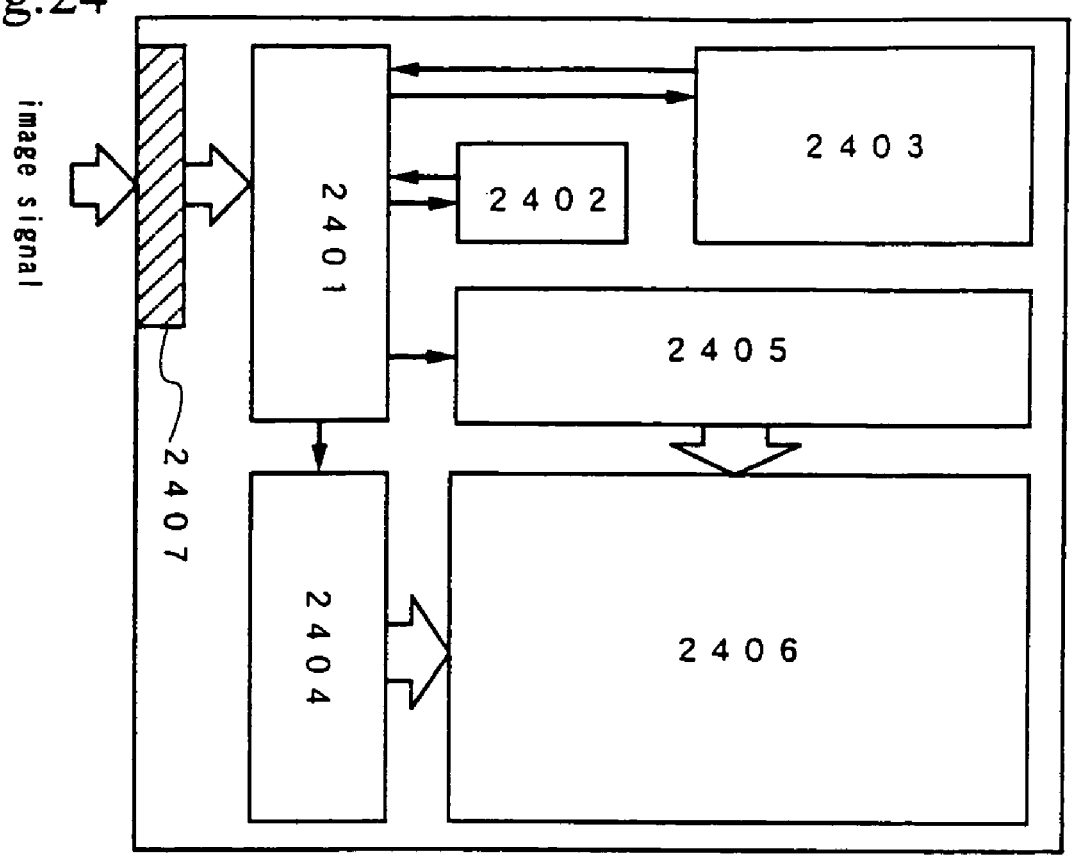
FIG. 24 shows another electrooptical device using the nonvolatile memory of the present invention.

In FIG. 24, there is shown a block diagram of an electrooptical device (typically, a liquid crystal display device or a light-emitting device) of this embodiment. The electrooptical device of this embodiment includes a nonvolatile memory 2403 of the present invention, an SRAM 2402, a pixel portion 2406, a gate signal side driving circuit 2404 and a source signal side driving circuit 2405 that are circuits for driving the pixel portion, and a memory controller circuit 2401. Also, an image signal, a clock signal, a synchronization signal, or the like is sent via a FPC (flexible print circuit) 2407.

The memory controller circuit 2401 of this embodiment means a control circuit for controlling operations for storing image data into and reading the image data from the SRAM 2402 and the nonvolatile memory 2403.

The SRAM 2402 is provided to perform high-speed data writing. It is possible to provide a DRAM instead of the SRAM. It is also possible to omit the SRAM so long as the nonvolatile memory is capable of performing high-speed writing. As to the SRAM 2402, the pixel portion 2406, the circuits 2404 and 2405 for driving the pixel portion, and the memory controller circuit 2401, there may be used publicly known circuit constructions.

In the electrooptical device of this embodiment, an image signal sent from the main body of a personal computer, a television receiving antenna, or the like is stored (memorized) in the SRAM 2402 in units of one frame and the image signal is sequentially inputted into the pixel portion 2406 by the memory controller circuit 2401 and is displayed. The SRAM 2402 stores image information corresponding to at least one frame of an image to be displayed on the pixel portion 2406. In the case where 6-bit digital signal is sent as the image signal, for instance, the memory is required to have a capacity that is at least equal to a multiplication result of the number of pixels by six bits. Also, as necessary, it is possible to store the image signal stored in the SRAM 2402 into the nonvolatile memory 2403 or to input the image signal stored in the nonvolatile memory 2403 into the pixel portion 2406 for display using the memory controller circuit 2401.

With the construction of this embodiment, an image displayed on the pixel portion 2406 is stored in the SRAM 2402 at all times, which makes it possible to easily pause the display of the image. Further, by storing the image signal stored in the SRAM 2402 into the nonvolatile memory 2403 or by inputting the image signal stored in the nonvolatile memory 2403 into the pixel portion, it becomes possible to easily perform operations such as the recording and reproduction of images. It also becomes possible to freely pause the display of a television program without recording the program using a videocassette recorder or the like and to perform recording and reproduction.

It should be noted here that it is possible to carry out this embodiment by freely combining with the construction of any of the first to sixth embodiments.

Tenth Embodiment

It is possible to embed the nonvolatile memory of the present invention into electronic equipment in any field as a recording medium that performs data storing and reading. In this embodiment, there will be described such electronic equipment.

As the electronic equipment for which it is possible to use the nonvolatile memory of the present invention, there may be listed a display, a video camera, a digital camera, a head mount type display, a DVD player, a game machine, a goggle type display, a car navigation device, a sonic reproduction apparatus (car audio equipment or the like), a personal computer, a personal digital assistant (a mobile computer, a mobile telephone, an electronic book, or the like). Examples of them are shown in FIGS. 25A to 26B.

Figure 25A:
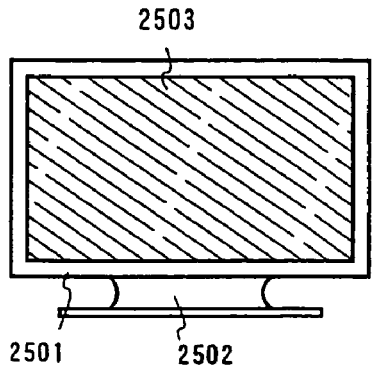
FIGS. 25A to 25F show an electronic equipment using the nonvolatile memory of the present invention.

FIG. 25A shows a display including a case 2501, a supporting base 2502, a display portion 2503, and the like. The present invention is connected to the display portion 2503 or another signal control circuit and is used to correct an image signal or store processing data.

Figure 25B:
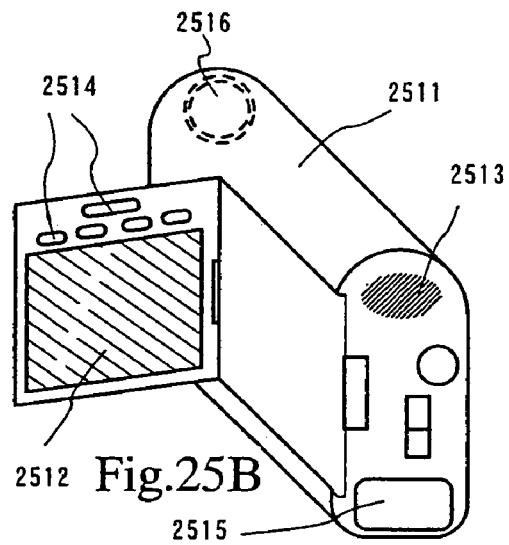

FIG. 25B shows a video camera that is constructed of a main body 2511, a display portion 2512, an audio input portion 2513, an operation switch 2514, a battery 2515, and an image-receiving portion 2516. The present invention is mounted on a built-in LSI substrate and is used to realize functions such as the storing of image data.

Figure 25C:
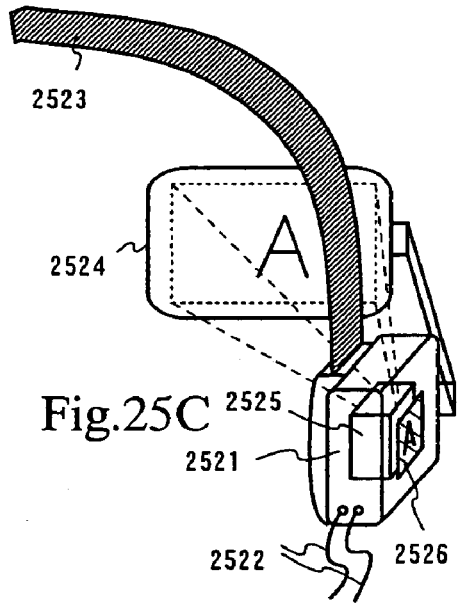

FIG. 25C shows a part (on the right side) of a head mount type display that includes a main body 2521, a signal cable 2522, a head fixing band 2523, a display portion 2524, an optical system 2525, a display device 2526, and the like. The present invention is connected to the display device 2526 and other signal control circuits and is used to correct an image signal and to store processing data.

Figure 25D:
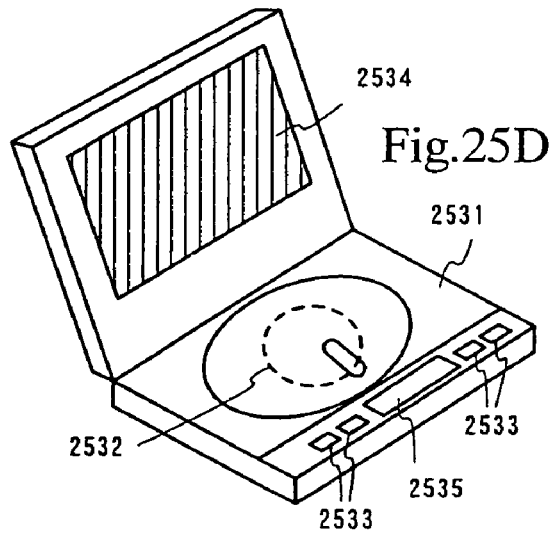

FIG. 25D shows an image reproduction apparatus (in more detail, a DVD reproduction apparatus) having a recording medium and is constructed of a main body 2531, a recording medium 2532, an operation switch 2533, a display portion (a) 2534, a display portion (b) 2535, and the like. Note that this apparatus uses a DVD (digital versatile disc), a CD, and the like as the recording medium, and is capable of allowing a user to enjoy music appreciation, movie appreciation, games, and the Internet. The present invention is mounted on a built-in LSI substrate and is used to realize functions such as the storing of image data and processing data.

Figure 25E:
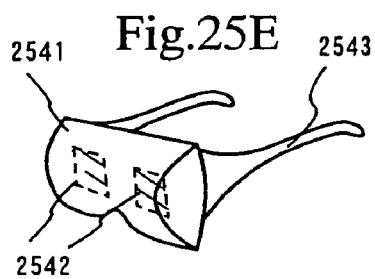

FIG. 25E shows a goggle type display that includes a main body 2541, a display portion 2542, and arm portions 2543. The present invention is connected to the display portion 2542 and other signal control circuits and is used to correct an image signal and to store processing data.

Figure 25F:
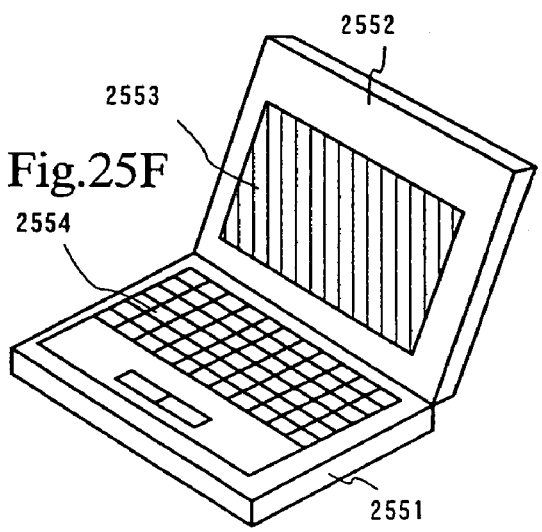

FIG. 25F shows a personal computer that is constructed of a main body 2551, a case 2552, a display portion 2553, a keyboard 2554, and the like. The present invention is mounted on a built-in LSI substrate and is used to store processing data and image data.

Figure 26A:
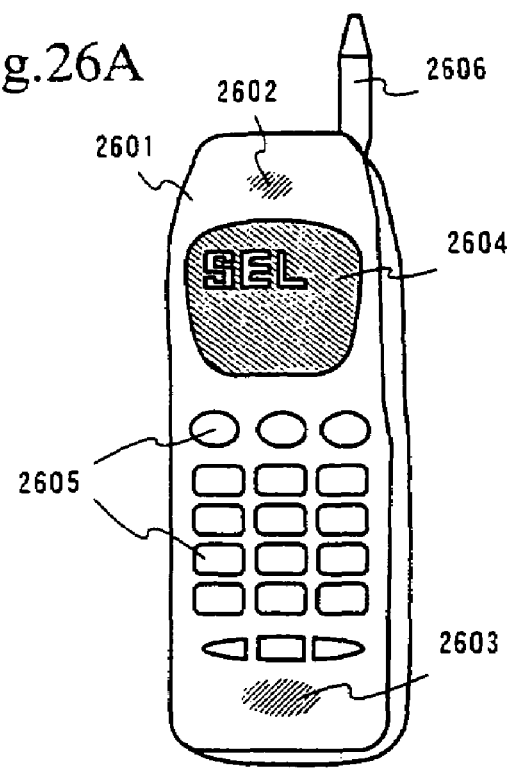
FIGS. 26A and 26B show an electronic equipment using the nonvolatile memory of the present invention.

FIG. 26A shows a mobile telephone that includes a main body 2601, a voice outputting portion 2602, a voice inputting portion 2603, a display portion 2604, an operation switch 2605, and an antenna 2606. The present invention is mounted on a built-in LSI substrate and is used to add various functions such as an address function for storing telephone numbers.

Figure 26B:
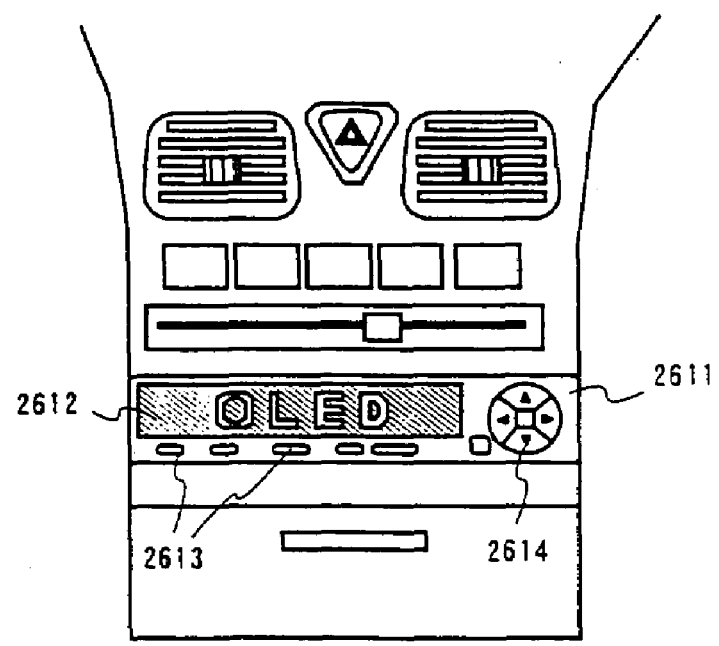

FIG. 26B shows a sonic reproduction apparatus (in more detail, a car audio equipment) that includes a main body 2611, a display portion 2612, and operation switches 2613 and 2614. The present invention is mounted on a built-in LSI substrate and is used to realize functions such as the storing of image data and processing data. Also, in this embodiment, although there is shown an in-car audio equipment, the present invention may be applied to a portable sonic reproduction apparatus or a sonic reproduction apparatus intended for home use.

As described above, the scope of application of the present invention is extremely wide and it is possible to apply the present invention to electronic equipment in every field. By applying the present invention, there is improved a speed at which a writing/erasing operation is performed for a nonvolatile memory, and there is realized high-performance electronic equipment that realizes a high-speed operation. Note that it is possible to realize the electronic equipment of this embodiment using a construction obtained through any combination of the first to sixth embodiments.

With the present invention, it becomes possible to perform a verify operation in which writing/erasing and reading are performed at the same time, which makes it possible to significantly shorten the time taken for a verify operation, in comparison with a conventional verify operation. As a result, it becomes possible to provide a nonvolatile memory that realizes threshold voltage distribution with a narrow distribution width and a high-speed operation.

Also, by applying the present invention to a multilevel nonvolatile memory, it becomes possible to provide a multilevel nonvolatile memory that realizes threshold voltage distribution with a narrow distribution width and a high-speed operation.

Further, by mounting the nonvolatile memory of the present invention that operates at high speed and excels in controlling a threshold voltage, it becomes possible to provide a semiconductor device, which has a nonvolatile memory with a high-performance or multifunctional nonvolatile memory, and which is capable of operating at high speed.

What is claimed is:

1. A NAND type nonvolatile memory comprising:
   means for simultaneously performing a first operation for increasing the threshold voltage of the memory element and a second operation for judging a relation between the threshold voltage of the memory element and the set voltage;
   means for, during the second operation, generating a verify signal that takes a first value if the threshold voltage of the memory element is smaller than the set voltage and takes a second value if the threshold voltage of the memory element is larger than the set voltage;
   means for performing the first operation if the verify signal takes the first value, and not performing the first operation if the verify signal takes the second value; and
   means for terminating the first operation and the second operation and finishing the verify operation when the verify signal changes from the first value to the second value,
   wherein the memory element is connected to another memory element in series.

2. The NAND type nonvolatile memory according to claim 1, wherein the memory element stores multi-state data.

3. The NAND type nonvolatile memory according to claim 1, wherein the first operation is performed by one of charge injection and charge discharge using a tunnel current.

4. The NAND type nonvolatile memory according to claim 1, wherein during the second operation, a potential difference exists between a source and a drain of the memory element.

5. The NAND type nonvolatile memory according to claim 1, wherein the first operation is performed by charge injection using a hot electron.

6. The NAND type nonvolatile memory according to claim 1, wherein the memory element is an n-channel type memory element.

7. The NAND type nonvolatile memory according to claim 1, wherein the memory element is a p-channel type memory element.

8. A NAND type nonvolatile memory comprising:
   means for simultaneously performing a first operation for decreasing the threshold voltage of the memory element and a second operation for judging a relation between the threshold voltage of the memory element and the set voltage;
   means for, during the second operation, generating a verify signal that takes a first value if the threshold voltage of the memory element is larger than the set voltage and takes a second value if the threshold voltage of the memory element is smaller than the set voltage;
   means for performing the first operation if the verify signal takes the first value, and not performing the first operation if the verify signal takes the second value; and
   means for terminating the first operation and the second operation and finishing the verify operation when the verify signal changes from the first value to the second value,
   wherein the memory element is connected to another memory element in series.

9. The NAND type nonvolatile memory according to claim 8, wherein the memory element stores multi-state data.

10. The NAND type nonvolatile memory according to claim 8, wherein the first operation is performed by one of charge injection and charge discharge using a tunnel current.

11. The NAND type nonvolatile memory according to claim 8, wherein during the second operation, a potential difference exists between a source and a drain of the memory element.

12. The NAND type nonvolatile memory according to claim 8, wherein the first operation is performed by charge injection using a hot electron.

13. The NAND type nonvolatile memory according to claim 8, wherein the memory element is an n-channel type memory element.

14. The NAND type nonvolatile memory according to claim 8, wherein the memory element is a p-channel type memory element.

15. A NAND type nonvolatile memory comprising:
   means for simultaneously performing a first operation for increasing the threshold voltage of the memory element and a second operation for judging a relation between the threshold voltage of the memory element and the set voltage;
   means for generating a verify signal that takes a first value during a first period;
   means for, during a second period, generating a verify signal that takes the first value if the threshold voltage of the memory element is smaller than the set voltage, and takes a second value if the threshold voltage of the memory element is larger than the set voltage;
   means for performing the first operation if the verify signal takes the first value, and not performing the first operation if the verify signal takes the second value; and means for terminating the first operation and the second operation and finishing the verify operation when the verify signal changes from the first value to the second value, wherein the memory element is connected to another memory element in series.

16. The NAND type nonvolatile memory according to claim 15, wherein the first period is 1 μsec or shorter.

17. The NAND type nonvolatile memory according to claim 15, wherein the memory element stores multi-state data.

18. The NAND type nonvolatile memory according to claim 15, wherein the first operation is performed by one of charge injection and charge discharge using a tunnel current.

19. The NAND type nonvolatile memory according to claim 15, wherein during the second operation, a potential difference exists between a source and a drain of the memory element.

20. The NAND type nonvolatile memory according to claim 15, wherein the first operation is performed by charge injection using a hot electron.

21. The NAND type nonvolatile memory according to claim 15, wherein the memory element is an n-channel type memory element.

22. The NAND type nonvolatile memory according to claim 15, wherein the memory element is a p-channel type memory element.

23. A NAND type nonvolatile memory comprising:

means for simultaneously performing a first operation for decreasing the threshold voltage of the memory element and a second operation for judging a relation between the threshold voltage of the memory element and the set voltage;

means for generating a verify signal that takes a first value during a first period;

means for, during a second period, generating a verify signal that takes the first value if the threshold voltage of the memory element is larger than the set voltage, and takes a second value if the threshold voltage of the memory element is smaller than the set voltage;

means for performing the first operation if the verify signal takes the first value, and not performing the first operation if the verify signal takes the second value; and means for terminating the first operation and the second operation and finishing the verify operation when the verify signal changes from the first value to the second value, wherein the memory element is connected to another memory element in series.

24. The NAND type nonvolatile memory according to claim 23, wherein the first period is 1 μsec or shorter.

25. The NAND type nonvolatile memory according to claim 23, wherein the memory element stores multi-state data.

26. The NAND type nonvolatile memory according to claim 23, wherein the first operation is performed by one of charge injection and charge discharge using a tunnel current.

27. The NAND type nonvolatile memory according to claim 23, wherein during the second operation, a potential difference exists between a source and a drain of the memory element.

28. The NAND type nonvolatile memory according to claim 23, wherein the first operation is performed by charge injection using a hot electron.

29. The NAND type nonvolatile memory according to claim 23, wherein the memory element is an n-channel type memory element.

30. The NAND type nonvolatile memory according to claim 23, wherein the memory element is a p-channel type memory element.

31. A NAND type nonvolatile memory comprising:

a circuit simultaneously performing a first operation for increasing the threshold voltage of the memory element and a second operation for judging a relation between the threshold voltage of the memory element and the set voltage;

wherein during the second operation, the circuit generates a verify signal that takes a first value if the threshold voltage of the memory element is smaller than the set voltage and takes a second value if the threshold voltage of the memory element is larger than the set voltage;

wherein the circuit performs the first operation if the verify signal takes the first value, and does not perform the first operation if the verify signal takes the second value; and wherein the circuit terminates the first operation and the second operation and finishes the verify operation when the verify signal changes from the first value to the second value, wherein the memory element is connected to another memory element in series.

32. The NAND type nonvolatile memory according to claim 31, wherein the memory element stores multi-state data.

33. The NAND type nonvolatile memory according to claim 31, wherein the first operation is performed by one of charge injection and charge discharge using a tunnel current.

34. The NAND type nonvolatile memory according to claim 31, wherein during the second operation, a potential difference exists between a source and a drain of the memory element.

35. The NAND type nonvolatile memory according to claim 31, wherein the first operation is performed by charge injection using a hot electron.

36. The NAND type nonvolatile memory according to claim 31, wherein the memory element is an n-channel type memory element.

37. The NAND type nonvolatile memory according to claim 31, wherein the memory element is a p-channel type memory element.

38. A NAND type nonvolatile memory comprising:

a circuit simultaneously performing a first operation for decreasing the threshold voltage of the memory element and a second operation for judging a relation between the threshold voltage of the memory element and the set voltage;

wherein during the second operation, the circuit generates a verify signal that takes a first value if the threshold voltage of the memory element is larger than the set voltage and takes a second value if the threshold voltage of the memory element is smaller than the set voltage;

wherein the circuit performs the first operation if the verify signal takes the first value, and does not perform the first operation if the verify signal takes the second value; and wherein the circuit terminates the first operation and the second operation and finishes the verify operation when the verify signal changes from the first value to the second value, wherein the memory element is connected to another memory element in series.

39. The NAND type nonvolatile memory according to claim 38, wherein the memory element stores multi-state data.

40. The NAND type nonvolatile memory according to claim 38, wherein the first operation is performed by one of charge injection and charge discharge using a tunnel current.

41. The NAND type nonvolatile memory according to claim 38, wherein during the second operation, a potential difference exists between a source and a drain of the memory element.

42. The NAND type nonvolatile memory according to claim 38, wherein the first operation is performed by charge injection using a hot electron.

43. The NAND type nonvolatile memory according to claim 38, wherein the memory element is an n-channel type memory element.

44. The NAND type nonvolatile memory according to claim 38, wherein the memory element is a p-channel type memory element.

45. A NAND type nonvolatile memory comprising:
a circuit simultaneously performing a first operation for increasing the threshold voltage of the memory element and a second operation for judging a relation between the threshold voltage of the memory element and the set voltage;
wherein the circuit generates a verify signal that takes a first value during a first period;
wherein during a second period, the circuit generates a verify signal that takes the first value if the threshold voltage of the memory element is smaller than the set voltage, and takes a second value if the threshold voltage of the memory element is larger than the set voltage;
wherein the circuit performs the first operation if the verify signal takes the first value, and does not perform the first operation if the verify signal takes the second value; and
wherein the circuit terminates the first operation and the second operation and finishes the verify operation when the verify signal changes from the first value to the second value,
wherein the memory element is connected to another memory element in series.

46. The NAND type nonvolatile memory according to claim 45, wherein the first period is 1 μsec or shorter.

47. The NAND type nonvolatile memory according to claim 45, wherein the memory element stores multi-state data.

48. The NAND type nonvolatile memory according to claim 45, wherein the first operation is performed by one of charge injection and charge discharge using a tunnel current.

49. The NAND type nonvolatile memory according to claim 45, wherein during the second operation, a potential difference exists between a source and a drain of the memory element.

50. The NAND type nonvolatile memory according to claim 45, wherein the first operation is performed by charge injection using a hot electron.

51. The NAND type nonvolatile memory according to claim 45, wherein the memory element is an n-channel type memory element.

52. The NAND type nonvolatile memory according to claim 45, wherein the memory element is a p-channel type memory element.

53. A NAND type nonvolatile memory comprising:
a circuit simultaneously performing a first operation for decreasing the threshold voltage of the memory element and a second operation for judging a relation between the threshold voltage of the memory element and the set voltage;
wherein the circuit generates a verify signal that takes a first value during a first period;
wherein during a second period, the circuit generates a verity signal that takes the first value if the threshold voltage of the memory element is larger than the set voltage, and takes a second value if the threshold voltage of the memory element is smaller than the set voltage;
wherein the circuit performs the first operation if the verity signal takes the first value, and does not perform the first operation if the verify signal takes the second value; and
wherein the circuit terminates the first operation and the second operation and finishes the verify operation when the verify signal changes from the first value to the second value,
wherein the memory element is connected to another memory element in series.

54. The NAND type nonvolatile memory according to claim 53, wherein the first period is 1 μsec or shorter.

55. The NAND type nonvolatile memory according to claim 53, wherein the memory element stores multi-state data.

56. The NAND type nonvolatile memory according to claim 53, wherein the first operation is performed by one of charge injection and charge discharge using a tunnel current.

57. The NAND type nonvolatile memory according to claim 53, wherein during the second operation, a potential difference exists between a source and a drain of the memory element.

58. The NAND type nonvolatile memory according to claim 53, wherein the first operation is performed by charge injection using a hot electron.

59. The NAND type nonvolatile memory according to claim 53, wherein the memory element is an n-channel type memory element.

60. The NAND type nonvolatile memory according to claim 53, wherein the memory element is a p-channel type memory element.

* * * * *